United States Patent
Liaw

(10) Patent No.: US 11,545,212 B2
(45) Date of Patent: Jan. 3, 2023

(54) DUAL PORT SRAM CELL WITH DUMMY TRANSISTORS

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/340,403

(22) Filed: Jun. 7, 2021

(65) Prior Publication Data
US 2021/0295902 A1    Sep. 23, 2021

Related U.S. Application Data

(60) Continuation of application No. 16/862,844, filed on Apr. 30, 2020, now Pat. No. 11,031,074, which is a continuation of application No. 16/372,694, filed on Apr. 2, 2019, now Pat. No. 10,672,460, which is a division of application No. 15/858,194, filed on Dec. 29, 2017, now Pat. No. 10,269,415, which is a continuation of application No. 15/249,885, filed on Aug. 29, 2016, now Pat. No. 9,858,985.

(60) Provisional application No. 62/243,242, filed on Oct. 19, 2015.

(51) Int. Cl.
*G11C 11/412*    (2006.01)
*G11C 8/16*    (2006.01)
*G11C 11/417*    (2006.01)

(52) U.S. Cl.
CPC .............. *G11C 11/412* (2013.01); *G11C 8/16* (2013.01); *G11C 11/417* (2013.01)

(58) Field of Classification Search
CPC ....... G11C 11/412; G11C 8/16; G11C 11/417; H01L 27/1104
See application file for complete search history.

(56) References Cited

U.S. PATENT DOCUMENTS

| | | | |
|---|---|---|---|
| 8,995,176 B2 | 3/2015 | Liaw | |
| 9,373,386 B2 | 6/2016 | Liaw | |
| 2004/0202035 A1 | 10/2004 | Tsujimura et al. | |
| 2007/0279965 A1 | 12/2007 | Nakazato et al. | |
| 2007/0280022 A1 | 12/2007 | Nguyen et al. | |
| 2008/0273382 A1 | 11/2008 | Wang | |
| 2010/0193877 A1 | 8/2010 | Liaw | |

(Continued)

OTHER PUBLICATIONS

Non-Final Office Action dated May 8, 2017 for U.S. Appl. No. 15/249,885.

(Continued)

*Primary Examiner* — Xiaochun L Chen
(74) *Attorney, Agent, or Firm* — Eschweiler & Potashnik, LLC

(57) ABSTRACT

A semiconductor device includes a semiconductor substrate including a fin of semiconductor material having a fin width and a fin length. The fin length is greater than the fin width and extends between a first fin end and a second fin end. A gate electrode extends over the fin at a first fin location between the first fin end and the second fin end. A dummy gate electrode extends over the first fin end and is floating.

20 Claims, 19 Drawing Sheets

(56) References Cited

U.S. PATENT DOCUMENTS

| | | |
|---|---|---|
| 2013/0141963 A1 | 6/2013 | Liaw |
| 2013/0154027 A1* | 6/2013 | Liaw .................. H01L 27/1104 |
| | | 257/E27.06 |
| 2013/0292777 A1 | 11/2013 | Liaw |
| 2014/0056050 A1 | 2/2014 | Yang et al. |
| 2014/0252508 A1 | 9/2014 | Cheng et al. |
| 2014/0254246 A1 | 9/2014 | Liaw |
| 2014/0282326 A1 | 9/2014 | Chen et al. |
| 2015/0109852 A1 | 4/2015 | Yang et al. |
| 2015/0235674 A1 | 8/2015 | Chi |
| 2015/0255462 A1 | 9/2015 | Liaw |

OTHER PUBLICATIONS

Notice of Allowance dated Aug. 29, 2017 for U.S. Appl. No. 15/249,885.
Non-Final Office Action dated Oct. 15, 2018 for U.S. Appl. No. 15/858,194.
Notice of Allowance dated Jan. 25, 2019 for U.S. Appl. No. 15/858,194.
Non-Final Office Action dated Aug. 29, 2019 for U.S. Appl. No. 16/372,694.
Notice of Allowance dated Jan. 27, 2020 for U.S. Appl. No. 16/372,694.
Notice of Allowance dated Feb. 4, 2021 for U.S. Appl. No. 16/862,844.

* cited by examiner

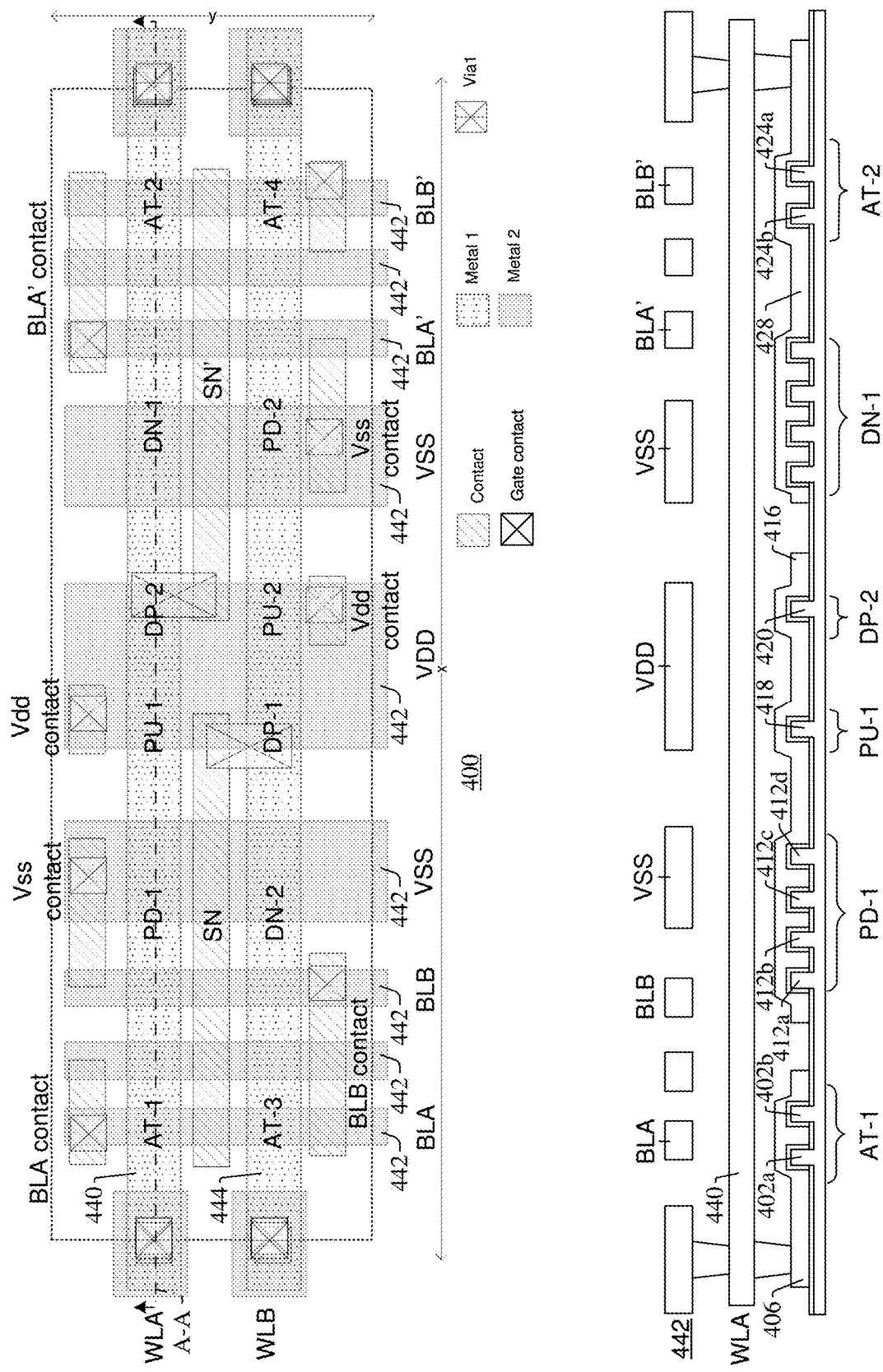

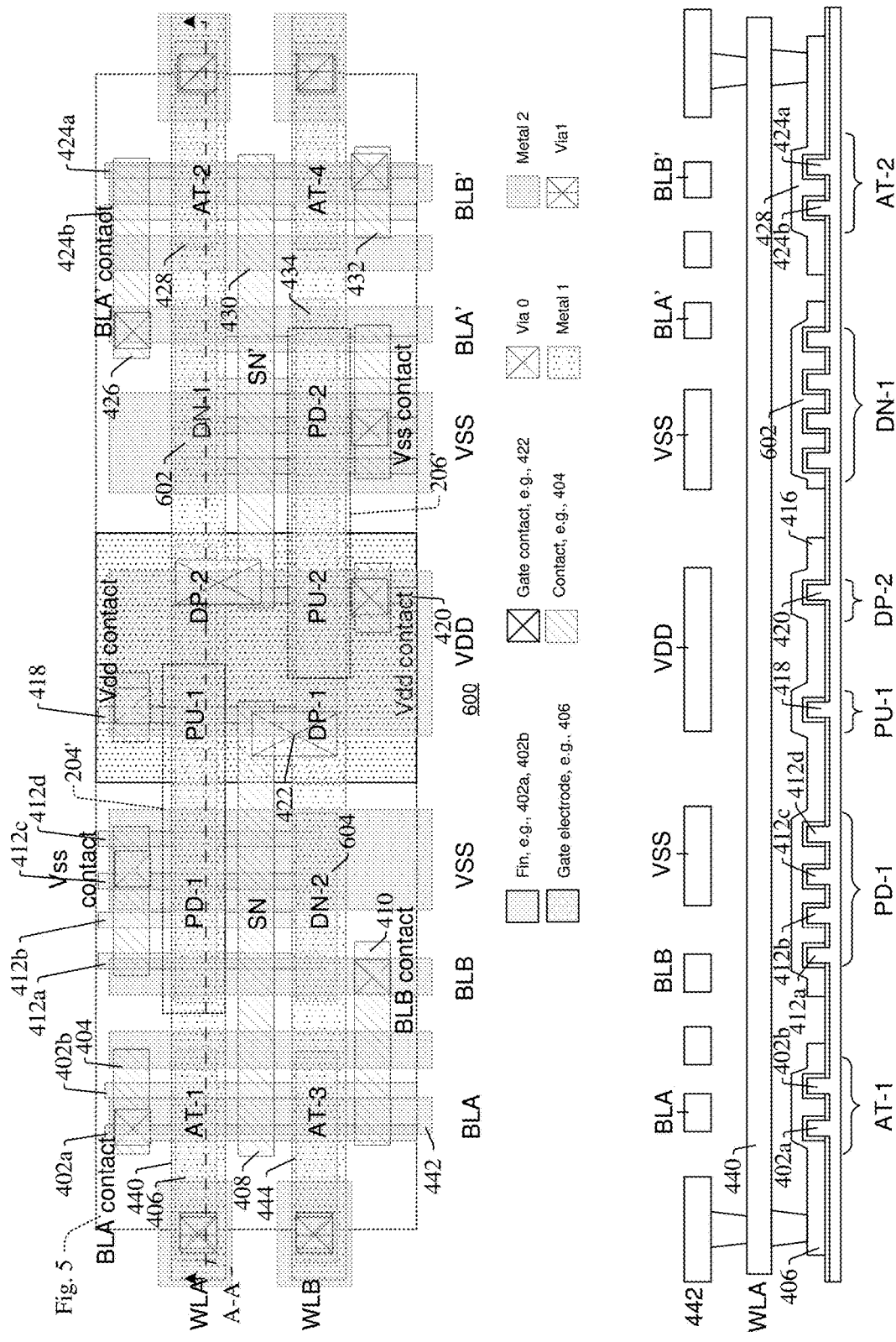

DUAL PORT SRAM CELL WITH DUMMY TRANSISTORS

REFERENCE TO RELATED APPLICATIONS

This Application is a Continuation of U.S. application Ser. No. 16/862,844, filed on Apr. 30, 2020, which is a Continuation of U.S. application Ser. No. 16/372,694, filed on Apr. 2, 2019 (now U.S. Pat. No. 10,672,460, issued on Jun. 2, 2020), which is a Divisional of U.S. application Ser. No. 15/858,194, filed on Dec. 29, 2017 (now U.S. Pat. No. 10,269,415, issued on Apr. 23, 2019), which is a Continuation of U.S. application Ser. No. 15/249,885, filed on Aug. 29, 2016 (now U.S. Pat. No. 9,858,985, issued on Jan. 2, 2018), which claims the benefit of U.S. Provisional Application No. 62/243,242, filed on Oct. 19, 2015. The contents of the above-referenced patent applications are hereby incorporated by reference in their entirety.

BACKGROUND

Semiconductor memory is an electronic data storage device implemented on a semiconductor-based integrated circuit. Semiconductor memory is made in many different types and technologies. Semiconductor memory has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D illustrate some embodiments of an SRAM cell consistent with some examples of FIG. 3.

FIGS. 6A-6D illustrate some alternative embodiments of layout view of an SRAM cell consistent with some examples of FIG. 3.

DETAILED DESCRIPTION

Figure 1:
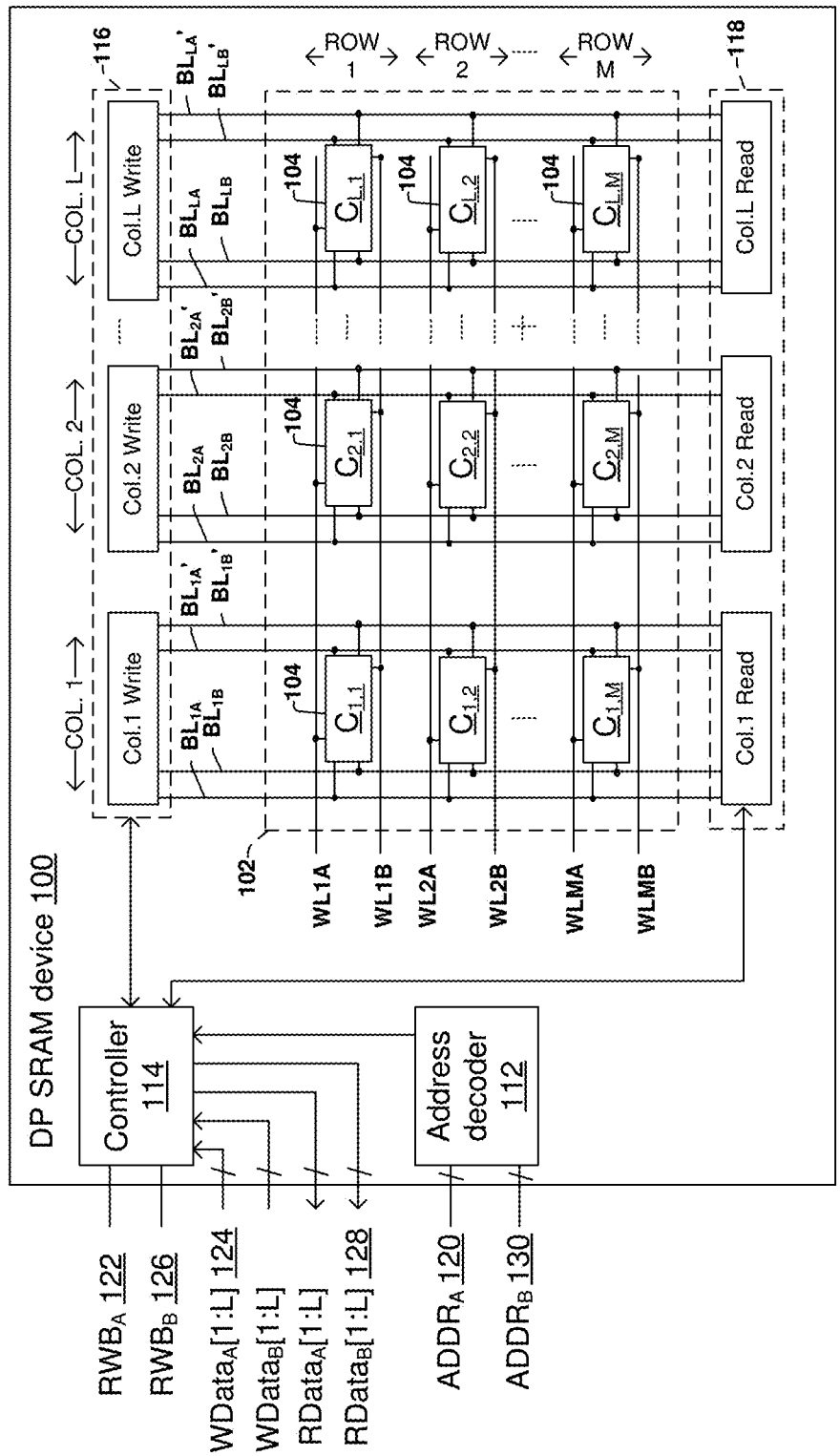
FIG. 1 illustrates a block diagram of a dual port static random access memory (DP SRAM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a dual-port static random access memory (DP SRAM) device 100. The DP SRAM device 100 includes an array 102 made up of a number of memory cells 104 which are arranged in L columns and M rows, where L and M can be any integers and can be the same or different from one another. For clarity, the individual memory cells 104 are labeled as $C_{COLUMN-ROW}$ ..., in FIG. 1.

As will be appreciated in more detail below, in the DP SRAM device 100, read and write operations can be made through two "ports", which are indicated by subscripts "A" and "B" in FIG. 1. Each port has its own set of wordlines and its own set of bitlines, which are separate from those of the other port. For example, along the rows of the array, port A includes wordlines WL1A, WL2A, ..., WLMA, while port B includes wordlines WL1B, WL2B, ..., WLMB. Along the columns of the array, port A includes complementary bitline pairs $BL_{1A}/BL_{1A}'$, $BL_{2A}/BL_{2A}'$, ..., $BL_{LA}/BL_{LA}'$; while port B includes complementary bitline pairs $BL_{1B}/BL_{1B}'$, $BL_{2B}/BL_{2B}'$, ..., $BL_{LB}/BL_{LB}'$. For each column, each pair of bitlines for a port are complementary in that one bit line in each pair is biased to carry a first voltage level corresponding to a logical "1" state, while the other bit line of the pair is biased to carry a second voltage level corresponding to a logical "0" state.

Each memory cell 104 resides at an intersection of a row and column and can be accessed through the two ports. Moreover, because of the two port design, data can be read to or written to two different rows of the array concurrently or at the same time. For example, a first row of memory cells (e.g., cells $C_{1,1}$ through $C_{L,1}$ of Row 1) can be accessed through a port A wordline (e.g., through WL1A), while a second row of memory cells (e.g., cells $C_{1,2}$ through $C_{L,2}$ of Row 2) can be concurrently accessed through port B wordline (e.g., through WL2B). While the wordlines are accessing these cells, the bitlines of port A can be used to read from or write to the first row of accessed memory cells while the bitlines of port B can be used to concurrently read from or write to the second row of accessed memory cells. An example write operation to port A and an example read operation to port B, which is concurrent with the write operation to port A, is now described in the following two paragraphs. Each port can typically perform read and write operations which may occur concurrently with operations on the other port.

To write data through port A to a first row of cells (e.g., memory cells $C_{1,1}$ through $C_{L,1}$), a port A read/write signal (RWB$_A$ 122) is provided to the memory device 100 in a first state (e.g., logical "0" indicating a write operation is to take place), along with an address specified in the port A ADDR$_A$ signal 120, and along with port A write data values 124. Upon receiving these signals, the address decoder 112 and controller 114 can collectively enable a port A wordline which corresponds to the address specified in the ADDR signal 120 (in this example WL1A). Thus, if the ADDR$_A$ signal 120 corresponds to Row 1, WL1A can be asserted to access memory cells $C_{1,1}$ through $C_{L,1}$. The controller 114 can then enable write circuitry 116 to apply respective differential biases to respective pairs of port A complementary bit lines (BL$_{1A}$, BL$_{1A}$', BL$_{2A}$, BL$_{2A}$', . . . , BL$_{LA}$, BL$_{LA}$') to write the port A write data values 124 to the accessed memory cells at the specified address.

At the same time that data is being written to the first row through port A, data can be concurrently read from a second row of cells (e.g., cells $C_{1,2}$ through $C_{L,2}$). For this read operation, the read/write signal (RWB$_B$ 126) is provided to the memory device 100 in a second state (e.g., logical "1" indicating a read operation is to take place). The respective port B complementary bit lines (BL$_{1B}$, BL$_{1B}$', . . . , BL$_{LB}$, BL$_{LB}$') are floated for the read operation, often being pre-charged to a voltage level that is between a logical "0" state and a logical "1" state. The address decoder 112 and controller 114 then assert the port B wordline (e.g., WL2B) for a row that corresponds to the address specified in the port B ADDR signal 130. The accessed cells (e.g., $C_{1,2}$ through $C_{L,2}$) along the row then drive a differential bias onto their respective pairs of port B complementary bit lines (BL$_{1B}$, BL$_{1B}$', BL$_{2B}$, BL$_{2B}$', . . . , through BL$_{LB}$, BL$_{LB}$'), causing differential biases, which correspond to data states stored in the respective cells, to be established on the respective complementary bit line pairs. For example, if cell $C_{1-2}$ stores a logical "1" value and $C_{2-2}$ stores a logical "0" value, assertion of wordline WL2B can lead to a first differential bias on BL$_{1B}$/BL$_{1B}$' (corresponding to a logical "1" which can be detected by Col. 1 read circuit in 118) and can concurrently lead to a second, different differential bias on BL$_{2B}$/BL$_{2B}$' (corresponding to a logical "0" which can be detected by Col. 2 read circuit in 118). The biased bit lines are then coupled to the read circuitry 118, which typically includes a sense amplifier for each column. After the sense amplifiers detect the respective differential biases, the sense amplifiers then latch the corresponding data values and deliver the read data to the memory interface as port B read data values 128.

As technology improves in such SRAM devices, feature sizes become smaller, leading to the use of so-called "fin-FET" transistors for the memory cells. FinFET transistors help to optimize data storage density, but make layouts difficult in many regards. Therefore, some embodiments of the present disclosure provide improved layouts for DP SRAM devices when FinFETs are used.

Figure 2:
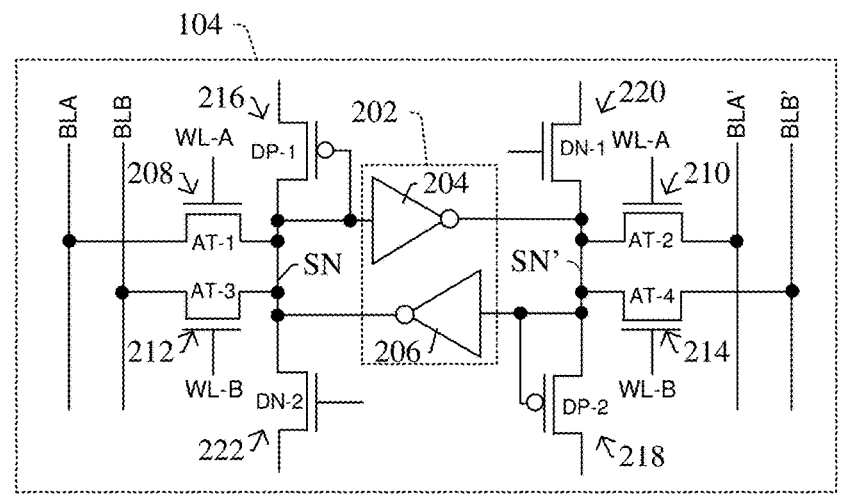
FIG. 2 illustrates a schematic diagram of a SRAM cell in accordance with some embodiments.

FIG. 2 illustrates a schematic of an SRAM cell 104 of FIG. 1's DP SRAM device 100 in accordance with some embodiments. The SRAM cell 104 includes a data storage element 202 made up of first and second inverters 204, 206, which are cross-coupled to one another to establish first and second data storage nodes, SN, SN'. The first and second data storage nodes SN, SN' are complementary in that one data storage node retains a first voltage level corresponding to a logical "1" state, while the other data storage node is biased to carry a second voltage level corresponding to a logical "0" state. Thus, the inverters 204, 206 store a bit of data in mutually reinforcing fashion.

Several access transistors (208, 210, 212, 214) selectively couple the first and second data storage nodes SN, SN' to bitlines (BLA, BLA', BLB, BLB', respectively), based on whether wordlines WLA, WLB are asserted, thereby allowing data to be selectively read from and written to the data storage element 202. Several "dummy" transistors 216, 218, 220, 222 are also coupled to the first and second data storage nodes SN, SN'.

With regards to port A, a first access transistor (AT-1) 208 is coupled to the first data storage node SN, and a second access transistor (AT-2) 210 is coupled to the second data storage node SN'. The first access transistor (AT-1) 208 selectively couples the first data storage node SN to bitline BLA based on a voltage level of first wordline WLA; while the second access transistor (AT-2) 210 selectively couples the second data storage node SN' to second bitline BLA' based on the voltage level of the first wordline WLA. Bitlines BLA, BLA' are complementary and thus form a first complementary bitline pair. The first access transistor (AT-1) 208 has a first source/drain region coupled to the first data storage node SN, a first drain/source region coupled to the first bitline BLA, and a first gate region coupled to the first wordline WLA. The second access transistor (AT-2) 210 has a second source/drain region coupled to the second data storage node SN', a second drain/source region coupled to a second bitline BLA', and a second gate region coupled to the first wordline WLA.

With regards to port B, a third access transistor (AT-3) 212 is coupled to the first data storage node SN, and a fourth access transistor 214 is coupled to the second data storage node SN'. The third access transistor (AT-3) 212 selectively couples the first data storage node SN to bitline BLB based on a voltage level of second wordline WLB; while the fourth access transistor (AT-4) 214 selectively couples the second data storage node SN' to fourth bitline BLB' based on the voltage level of the second wordline WLB. Bitlines BLB, BLB' are complementary and thus form a second complementary bitline pair. The third access transistor (AT-3) 212 has a third source/drain region coupled to the first data storage node SN, a third drain/source region coupled to a third bitline BLB, and a third gate region coupled to the second wordline WLB. The fourth access transistor (AT-4) 214 has a fourth source/drain region coupled to the second data storage node SN', a fourth drain/source region coupled to a fourth bitline BLB', and a fourth gate region coupled to the second wordline WLB. Because the access transistors 208-214 provide bi-directional current flow, it will be appreciated that the terms "source/drain" and "drain/source" are somewhat arbitrary here and could be exchanged.

The SRAM cell 104 also includes several dummy transistors, which manifest themselves as p-type devices and n-type devices in FIG. 2. A first dummy transistor (DP-1) 216 has a first dummy source/drain region coupled to the first data storage node SN; and a second dummy transistor (DP-2) 218 has a second dummy source/drain region coupled to the second data storage node SN'. In some embodiments, the first dummy transistor (DP-1) 216 is a p-type transistor having a gate and a first dummy source/ drain region that are coupled to the first data storage node SN, and a first dummy drain/source region that is floating or coupled to a first predetermined bias. The second dummy transistor (DP-2) 218 is a p-type transistor having a gate and second dummy source/drain region that are coupled to the second data storage node SN', and a second dummy drain/source region that is floating or coupled to a second predetermined bias, which can be the same or different from the first predetermined bias.

A third dummy transistor (DN-1) 220 has a third dummy source/drain region coupled to the second data storage node SN', and has a third dummy drain/source region that can be floating or coupled to a third pre-determined voltage. A fourth dummy transistor (DN-2) 222 has a fourth dummy source/drain region coupled to the first data storage node SN, and has fourth dummy drain/source region that can be floating or coupled to a fourth predetermined bias, which can be the same or different from the third pre-determined voltage. The gates of the third and fourth dummy transistors can be connected in various configurations. For example, in some embodiments, the third and fourth dummy transistors (DN-1, DN-2) 220, 222 have their gates coupled directly to the first and second wordlines WLA, WLB respectively. See e.g., FIGS. 4A-4D discussed further herein. In other embodiments, the third and fourth dummy transistors (DN-1, DN-2) 220, 222 each have a gate that is floating. See e.g., FIGS. 6A-6D discussed further herein. In still other embodiments, the third and fourth dummy transistors (DN-1, DN-2) 220, 222 each have a gate coupled to ground. See e.g., FIGS. 7A-7D and FIGS. 8A-8D discussed further herein.

It will be appreciated that the terms "first", "second", "third", "fourth", and the like are merely generic identifiers, and as such may be interchanged in various embodiments. Thus, although dummy transistor 216 is referred to as a "first" dummy transistor with regards to FIG. 2, in other embodiments, dummy transistor 218, dummy transistor 220, or dummy transistor 222 may be interpreted as being a "first" dummy transistor. Similarly, although dummy transistor 218 is referred to as a "second" dummy transistor with regards to FIG. 2, in other embodiments, dummy transistor 216, dummy transistor 220, or dummy transistor 222 may be interpreted as being a "second" dummy transistor. The same is true for the "third" dummy transistor, "fourth" dummy transistor, access transistors, and so on.

Figure 3:
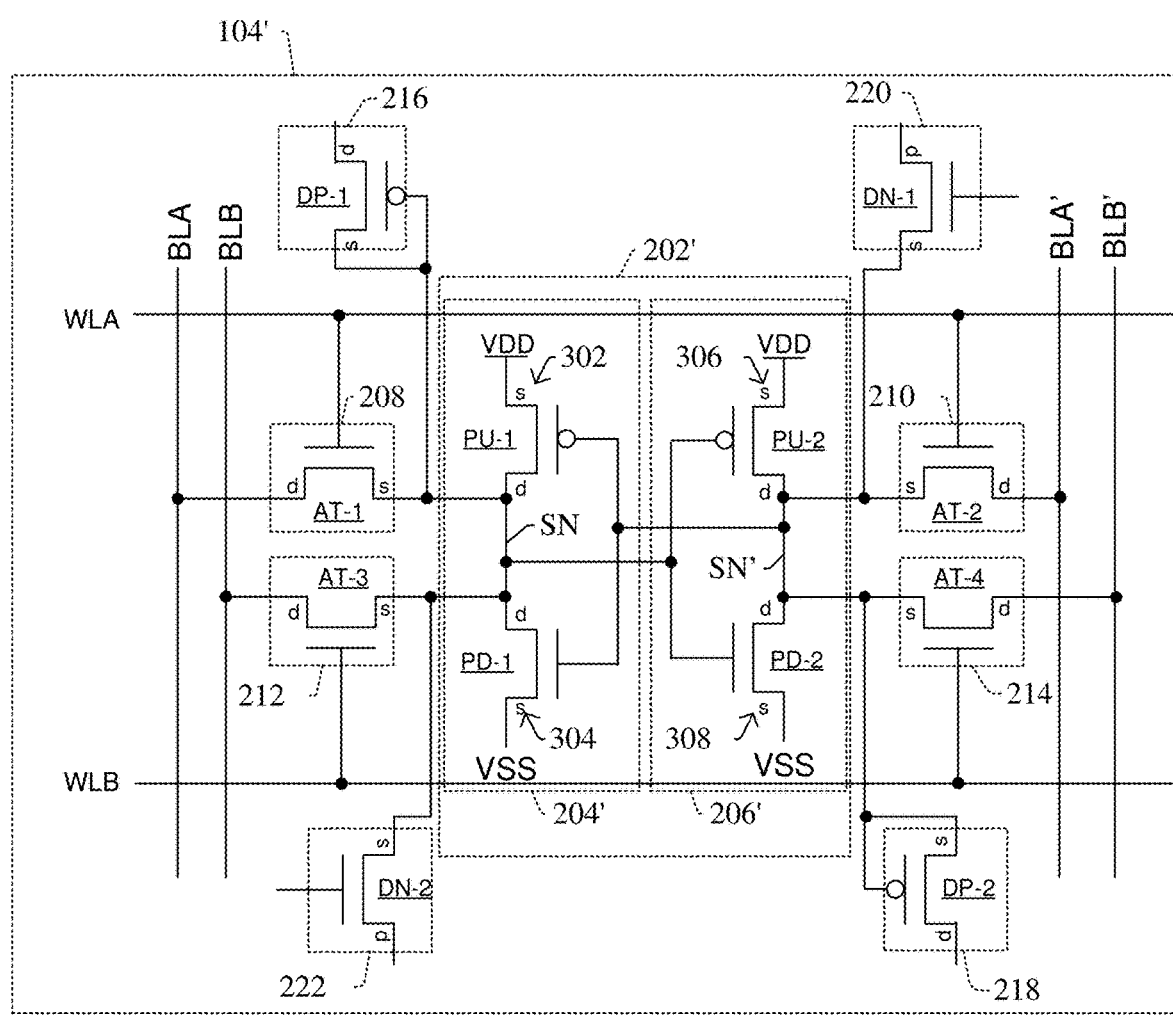
FIG. 3 illustrates a schematic diagram of a SRAM cell that includes twelve transistors in accordance with some embodiments.

FIG. 3 shows some embodiments of a transistor schematic of an SRAM cell 104' consistent with FIG. 2's schematic. The SRAM cell 104' includes a data storage element 202' made up of first and second inverters 204', 206', which are cross-coupled to establish first and second data storage nodes SN, SN'. The first inverter 204' includes a first pull-up transistor (PU-1) 302 and a first pull-down transistor (PD-1) 304. The second inverter 206' includes a second pull-up transistor (PU-2) 306 and a second pull-down transistor (PD-2) 308.

Several access transistors selectively couple the first and second data storage nodes SN, SN' to bitlines (BLA, BLA', BLB, BLB'), thereby allowing data to be selectively read from and written to the data storage element 202'. With regards to port A, a first access transistor 208 is coupled to the first data storage node SN, and a second access transistor 210 is coupled to the second data storage node SN'. The first access transistor (AT-1) 208 has a first source/drain region coupled to the first data storage node SN', a first drain/source region coupled to a first bitline BLA, and a first gate region coupled to a first wordline WLA. The second access transistor (AT-2) 210 has a second source/drain region coupled to the second data storage node SN', a second drain/source region coupled to a second bitline BLA', and a second gate region coupled to the first wordline WLA. With regards to port B, a third access transistor (AT-3) 212 is coupled to the first data storage node SN, and a fourth access transistor 214 is coupled to the second data storage node SN'. The third access transistor (AT-3) 212 has a third source/drain region coupled to the first data storage node SN, a third drain/source region coupled to a third bitline BLB, and a third gate region coupled to a second wordline WLB. The fourth access transistor (AT-4) 214 has a fourth source/drain region coupled to the second data storage node SN', a fourth drain/source region coupled to a fourth bitline BLB', and a fourth gate region coupled to the second wordline WLB.

A first dummy transistor (DP-1) 216 has a first dummy source/drain region coupled to the first data storage node SN; and a second dummy transistor (DP-2) 218 has a second dummy source/drain region coupled to the second data storage node SN'. A third dummy transistor (DN-1) has a third dummy source/drain region coupled to the first data storage node SN; and a fourth dummy transistor (DN-2) has a fourth dummy source/drain region coupled to the second data storage node SN'.

Figure 4A:
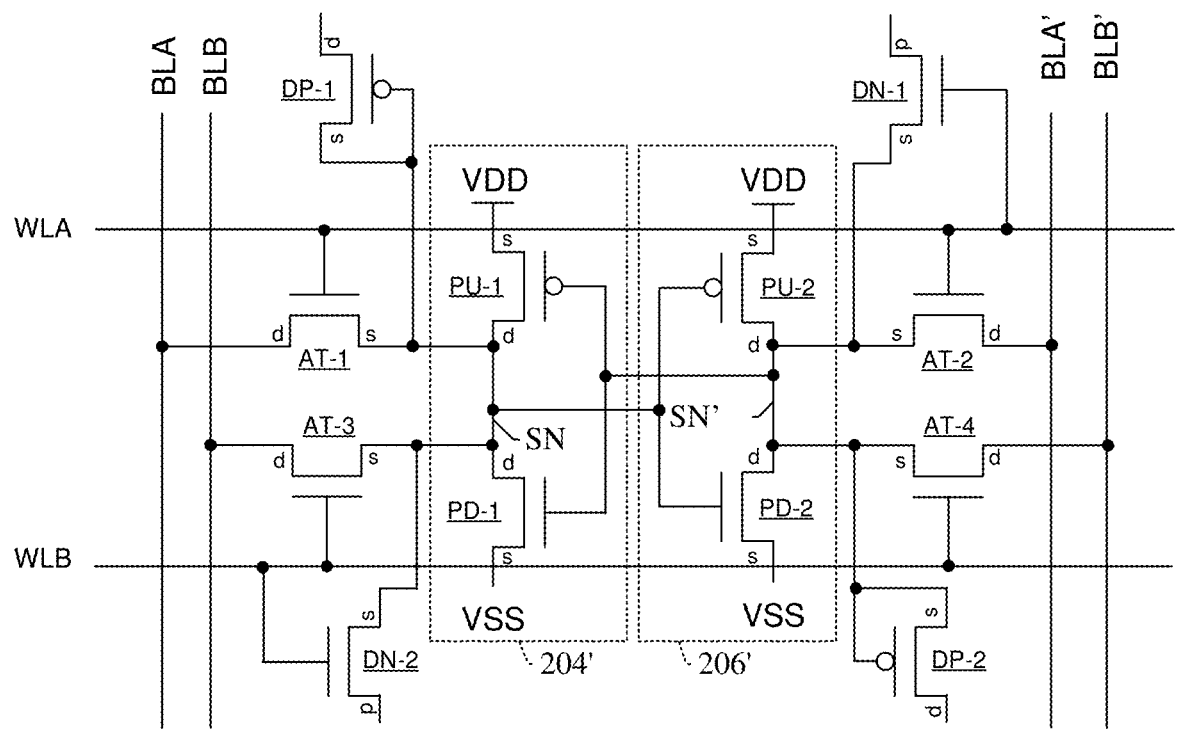
Figure 4B:
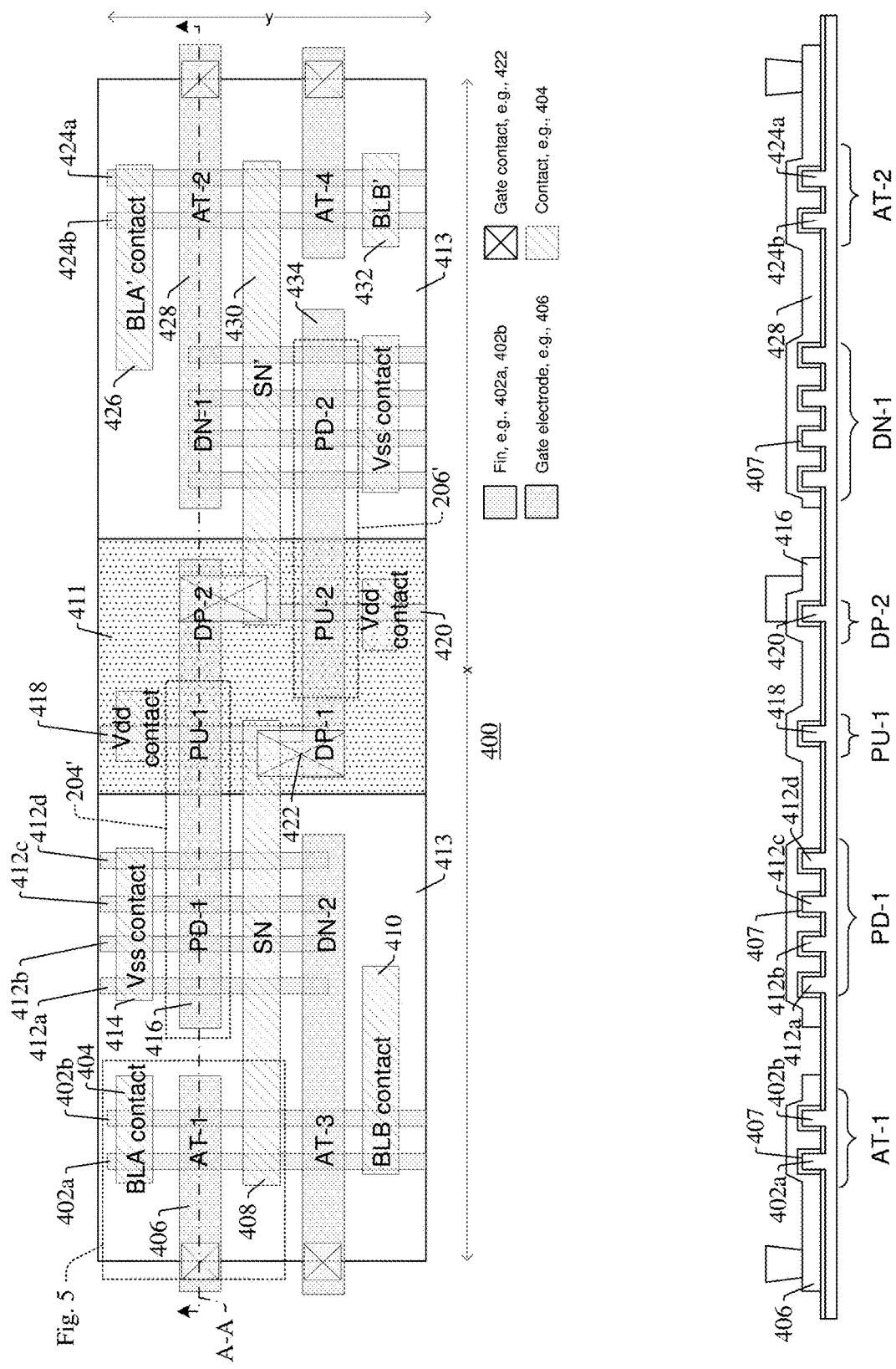
Figure 4D:
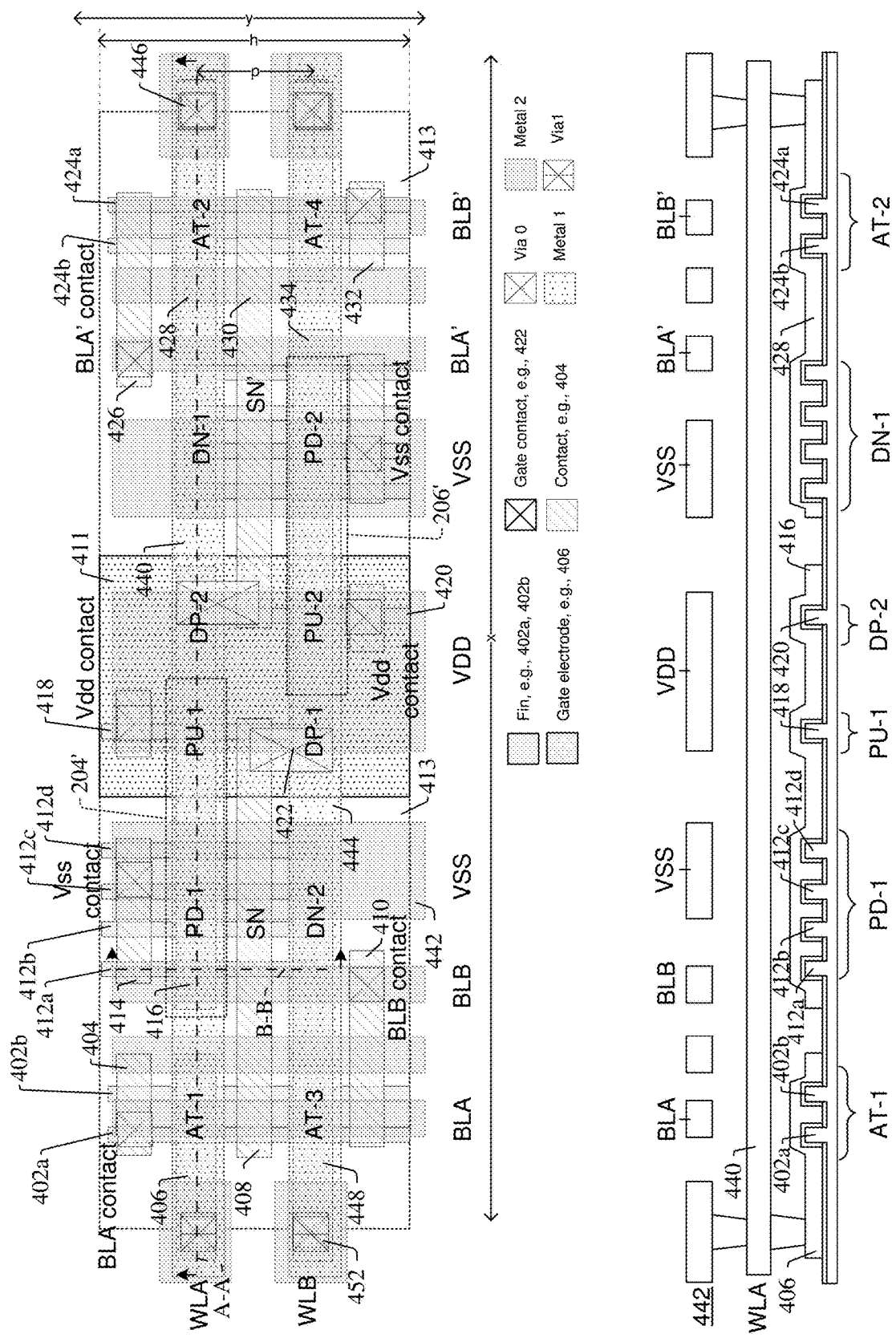

FIG. 4A illustrates a schematic of an SRAM cell 400 where gates of dummy transistors DN-1 and DN-2 are coupled to WLA and WLB, respectively. FIGS. 4B-4D illustrate some embodiments of an SRAM cell layout consistent with FIG. 4A's SRAM cell 400. FIG. 4B illustrates lower layers of the layout (e.g., fins, gate electrodes, gate contacts, and contacts), FIG. 4C illustrates upper layers of the layout (e.g., contacts, gate contacts, metal1, metal 2, and vial layers), and FIG. 4D illustrates the superposition of FIGS. 4B-4C. For clarity, in FIGS. 4A through FIG. 4D, the transistors of the SRAM cell layout have been labeled as PU-1, PU-2, PD-1, PD-2, AT-1, AT-2, AT-3, AT-4, DP-1, DP-2, DN-1, and DN-2 consistent with FIG. 3's transistor schematic for SRAM cell 104'. To show how the layers of the layout for the SRAM cell 400 are stacked, FIGS. 4B-4D each have a lower cross-sectional view taken along line A-A in the corresponding upper layout view.

Turning now to FIG. 4B's layout view, fins (e.g., 402a, 402b) extend over a substrate in a first direction (e.g., y-direction). The fins are made of semiconductor material, and are often spaced at a regular interval or pitch relative to one another. Gate electrodes (e.g., 406, 416, 428) traverse over the fins in a second direction (e.g., x-direction, which is perpendicular to the first direction), and can be made of doped polysilicon or metal for example. Gate dielectric material 407 separates the fins from the gate electrodes. The gate electrodes overlie at least one semiconductor fin to establish each fin field effect transistor (FinFET). Pull-up transistors (PU-1, PU-2), and dummy p-type transistors (DP-1, DP2) correspond to n-type fins, and have p-type source/drain regions on opposite sides of their gates electrodes; while access transistors (AT-1, AT-2, AT-3, AT-4), pull-down transistors (PD-1, PD-2), and dummy n-type transistors (DN-1, DN-2), correspond to p-type fins and have n-type source/drain regions on opposite sides of their gates. Thus, drain terminals of both pull-down and pull-up transistors have individual dummy gates located adjacent. For example, the drain of PD-1 has dummy transistor DN-2 located adjacent, and drain of PU-1 has dummy transistor DP-1 located adjacent, for example. The fins of the pull-down transistors and pull-up transistors extend partially under the bottom of the dummy gate. For example, fin 412a of PD-1 extends partially under the gate electrode of dummy gate DN-2.

The gate electrodes are also often spaced at a regular interval or pitch relative to one another, which can be the same or different from the spacing or pitch of the fins. For some of the transistors, such as transistors PU-1 and PU-2, the gate electrode overlies only a single fin; whereas for other transistors, such as transistors AT-1, PD-1, DN-2, and AT-2 for example, the gate electrode overlies multiple semiconductor fins. Further, in some embodiments, the access transistors (AT-1, AT-2, AT-3, AT-4) each deliver a larger current than either PU-1 and PU-2 to have sufficient write margin. Because of this, the access transistors (AT-1, AT-2, AT-3, AT-4) each have 2 fins while the pull-up transistors (PU-1, PU-2) each have only a single fin, and the pull down transistors have four fins or more to properly balance the currents for good read margins.

The source/drain regions can be doped regions of the fin in some embodiments, but are often epitaxially grown source/drain regions that exhibit a diamond-shaped cross-sectional profile. Bitline A (BLA) is coupled to fins 402a, 402b, which act as a drain region of transistor AT-1, through BLA contact 404. Fins 402a, 402b of transistor AT-1 extend under gate electrode 406 of AT-1. Source region of AT-1 is coupled to first data storage node SN contact 408 and is coupled to source region of transistor AT-3 though fins 402a, 402b. Bitline B (BLB) is coupled to drain region of transistor AT-3 through contact 410. First data storage node SN contact 408 is coupled to fins 412a-412d at drain of transistor PD-1 and at source of transistor DN-2. Source of transistor PD-1 is coupled to Vss through VSS contact 414, while drain of transistor DN-2 is floating. Gate electrode 416 also extends over fin 418 and fin 420 to establish transistors PU-1 and DP-2. Source of transistor PU-1 is coupled to VDD, while drain of PU-1 is coupled to first data storage node SN and butted contact 422. In some embodiments, elongated contacts 408 may connect the source/drain nodes of PU-1, PD-1, AT-1, and AT-3. The butted contact 422 is elongated in the y-direction of the layout, which makes for a connection friendly cell layout.

On the other side of the layout 400, BLA' is coupled to fins 424a, 424b, which act as a drain region of transistor AT-2, through BLA' contact 426. Fins 424a, 424b of transistor AT-2 extend under gate 428 of AT-2. Source region of AT-2 is coupled to second data storage node SN' contact 430 and is coupled to source region of transistor AT-4 though fins 424a, 424b. BLB' is coupled to drain region of transistor AT-4 through BLB' contact 432. Second data storage node SN' contact 430 is coupled to drain of transistor PD-2 and source of transistor DN-1. Source of transistor PD-2 is coupled to Vss, while drain of transistor DN-1 is floating. Gate electrode 434 of PD-2 also extends over fins 420, 418 to establish transistors PU-2, DP-1, respectively. Source of transistor PU-2 is coupled to VDD, while drain of PU-2 is coupled to source of DP-2.

FIG. 4C illustrates how metal 1, metal 2, and via 1 layers can be used to electrically couple the transistors of SRAM cell layout 400. Metal 1 lines 440, 444 respectively which correspond to a first wordline (WLA) and a second wordline (WLB), respectively, extend over the SRAM cell layout in the second direction. The metal 1 lines are stacked over the gate electrodes. Metal 2 lines 442, which correspond to bitlines (BLA, BLB, BLA', and BLB') and power lines (VSS, VDD) and arranged over the metal 1 lines 440, 444 and extend in the first direction. Gate contacts extend downwardly from the metal 1 lines and/or metal 2 lines to make electrical connection with the gate electrodes. Via1's extend downwardly from the metal 2 lines to make electrical connection with the metal 1 lines.

FIG. 4C illustrates how metal 1, metal 2, and via 1 layers can be used to electrically couple the transistors of SRAM cell layout 400. Metal 1 lines 440, 444 respectively which correspond to a first wordline (WLA) and a second wordline (WLB), repectively, extend over the SRAM cell layout in the second direction. The metal 1 lines are stacked over the gate electrodes. Metal 2 lines 442, which correspond to bitlines (BLA, BLB, BLA', and BLB') and power lines (VSS, VDD) and arranged over the metal 1 lines 440, 444 and extend in the first direction. Gate contacts extend downwardly from the metal 1 lines and/or metal 2 lines to make electrical connection with the gate electrodes. Via1's extend downwardly from the metal 2 lines to make electrical connection with the metal 1 lines.

In FIG. 4D, a superposition of FIGS. 4B-4C is shown. It will appreciated that the gate electrode 428 of dummy transistor DN-1 is coupled to wordline A 440 through contact 446. Further, the gate electrode 448 of dummy transistor DN-2 is coupled to wordline B 444 through contact 452. Thus, gates electrodes of the dummy transistors DN-1, DN2 can be coupled to WLA, WLB, respectively, as illustrated in FIG. 4A. Although the SRAM cell layout 400 depicts only a single SRAM cell, a number of such SRAM cell layouts 400 may be included in an integrated circuit, such that neighboring SRAM cells fit together in a tile-like fashion. In many embodiments, neighboring SRAM cells directly above and below one another are flipped vertically, while neighboring SRAM cells directly to the left and right of one another are flipped horizontally to achieve efficient packing together of the SRAM cells.

As shown in top view 400 of FIG. 4D, the cell layout comprises a unidirectional routing for some layers. For example, the active regions (411, 413), fins (e.g., 412a) and metal-2 lines (include BLA, BLB, Vss and Vdd) follow y-direction, while the gate electrodes (e.g., 406), contacts (e.g., 404) and metal-1 lines (WLA, WLB) follow the x direction.

In some embodiments, the layout shapes from the active layers up through the metal1 and metal2 layers are straight lines which are compatible with self-aligned double-patterning lithography techniques for back-end-of-line (BEOL) and front-end-of-line (FEOL) routing. In self-aligned double-patterning techniques, a first layer is patterned by forming a lithographic mask over the first layer, then etching the layer to remove exposed portion of the first layer while leaving a mandrel in a region covered by the lithographic mask. Spacers are then formed on opposite sidewalls of the mandrel, for example by performing a conformal deposition followed by an etch back process. Because of this manner in which they are formed, the spacers (which can correspond to features such as M1 lines, M2 lines, etc. in the layer) can double the pattern density (or equivalently cut the pitch in half) of features in the layout to help lithography tools to reduce feature sizes. These self-aligned double-patterning techniques are applicable to straight features, and because of this, the layer shapes illustrated in FIG. 4D are straight lines in order to allow self-aligned double-patterning techniques to be used, thereby providing increased memory density.

Figure 5A:
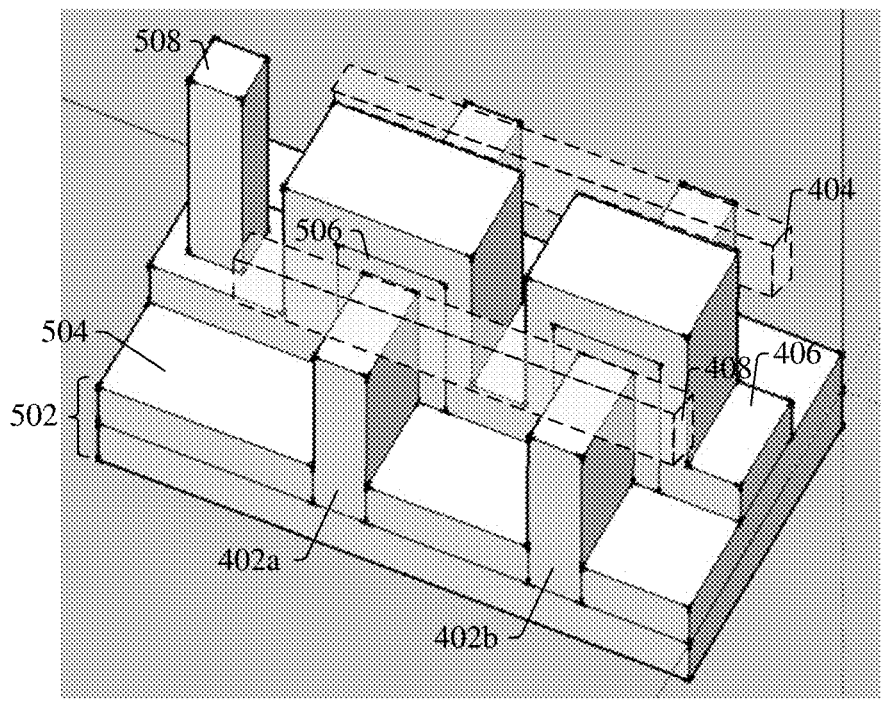
FIG. 5A illustrates some embodiments of a perspective view of an SRAM access transistor which is implemented as a FinFET in accordance with some embodiments.

FIG. 5A shows a perspective view 500 of first access transistor AT-1 (see FIG. 4B) in accordance with some embodiments. The first access transistor AT-1 includes a pair of semiconductor fins 402a, 402b running parallel to one another over a semiconductor substrate 502. In some embodiments, the semiconductor substrate 502 can be a bulk silicon substrate or a semiconductor-on-insulator (SOI) substrate (e.g., silicon on insulator substrate). The fins 402a, 402b extend upwardly from the semiconductor substrate 502 through openings in an isolation region 504, such as a silicon dioxide or low-k dielectric layer (e.g., buried oxide (BOX) layer). A conductive gate electrode 406 straddles both semiconductor fins 402a, 402b, and a gate dielectric 506, such as a SiO2 or high-k dielectric, separates the gate electrode 406 from the semiconductor fins 402a, 402b. Contacts 404, 408, which may also be referred to as local interconnect lines in some embodiments, extend over the fins 402a, 402b, and couple the fins 402a, 402b to one another. Gate contact 508 couples the gate electrode 406 to a metal 1 layer (not shown).

Figure 5B:
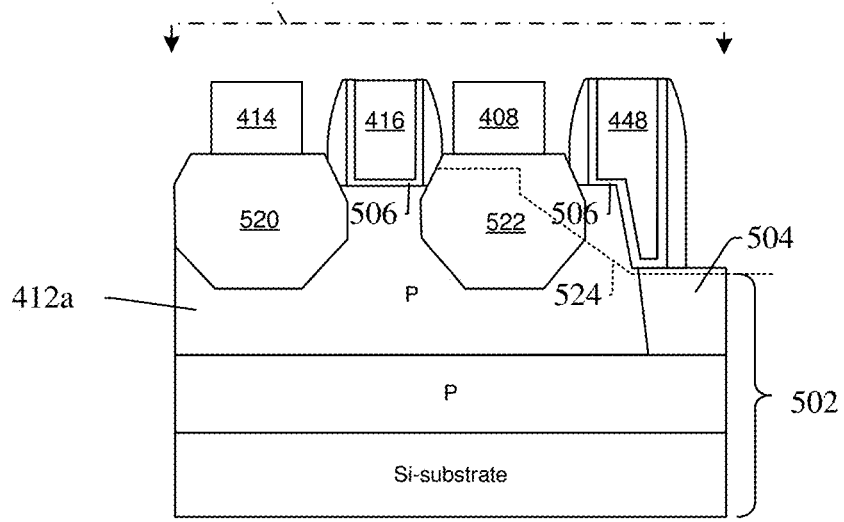
FIG. 5B illustrates some embodiments of a cross-sectional view along line B-B of FIG. 4D.

FIG. 5B shows a cross-sectional view of FIG. 4D's layout along fin 412a, as indicated by cross-sectional line B-B in FIG. 4D. As shown in FIG. 5B, fin 412a, which is made of p-type monocrystalline silicon, extends over semiconductor substrate 502 and extends upward from substrate 502 through an opening in isolation region 504. A gate dielectric 506 separates gate electrodes 416, 448 from the fin 412a; and N-type epitaxially-grown source/drain regions 520, 522 are formed in recesses in the fin 412a. As the illustrated portion of gate electrode 416 in FIG. 5B corresponds to transistor PD1, the fin 412a extends entirely under gate 416. However, as the illustrated portion of gate electrode 448 in FIG. 5B corresponds to dummy transistor DN2, the fin 412a terminates under the gate electrode 448 without extending out beyond both edges of the gate electrode 448. Notably, the presence of the dummy gates, for example the gate electrode 448 of dummy transistor DN2, improves the shape of the source/drain region 522, which is formed epitaxially. In comparison, for example if the gate electrode 448 was not present, an outer edge of source/drain region 522 could "slump", for example as shown by line 524, which can cause manufacturing issues. Thus, the gate electrode 448 of dummy transistor DN2 helps to bolster the source/drain region 522 and improves manufacturing. The other dummy transistors DN1, DP1, DP2 can also provide similar improvements in manufacturing, by preventing the outer edges of source/drain regions from slumping (e.g., shown by line 524) and thereby improving the uniformity of the source/drain regions over the entire SRAM device.

Figure 6A:
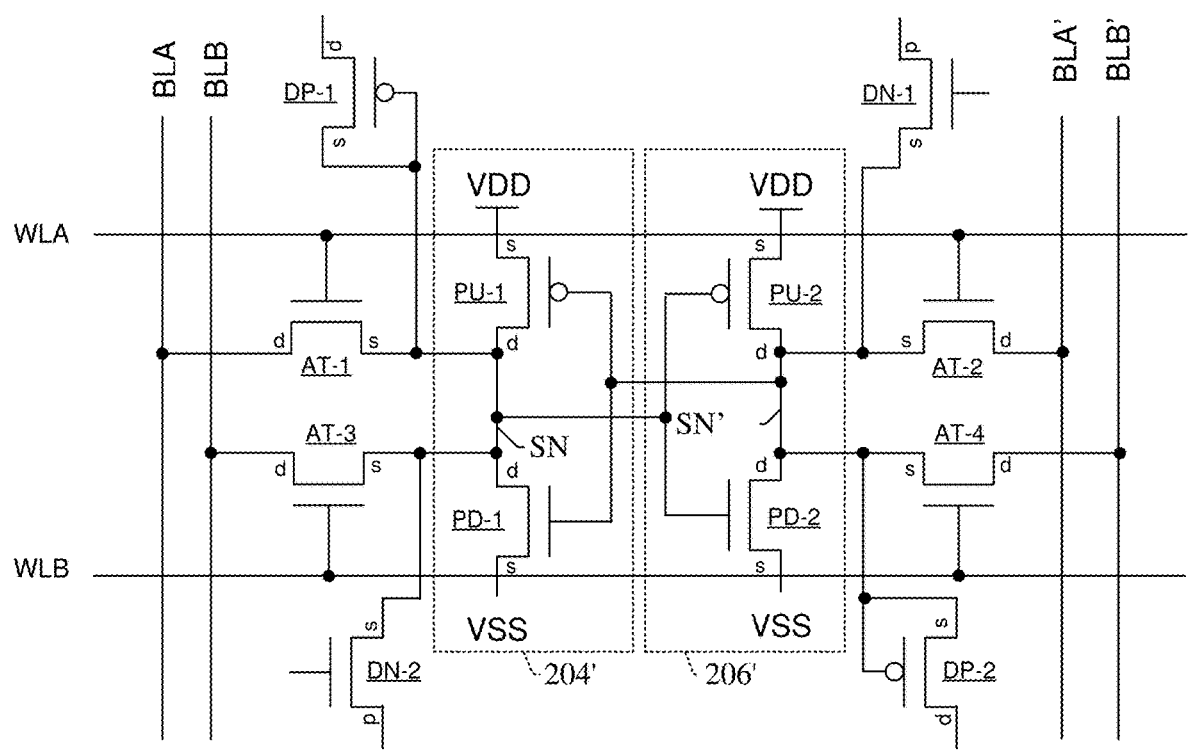
Figure 6B:
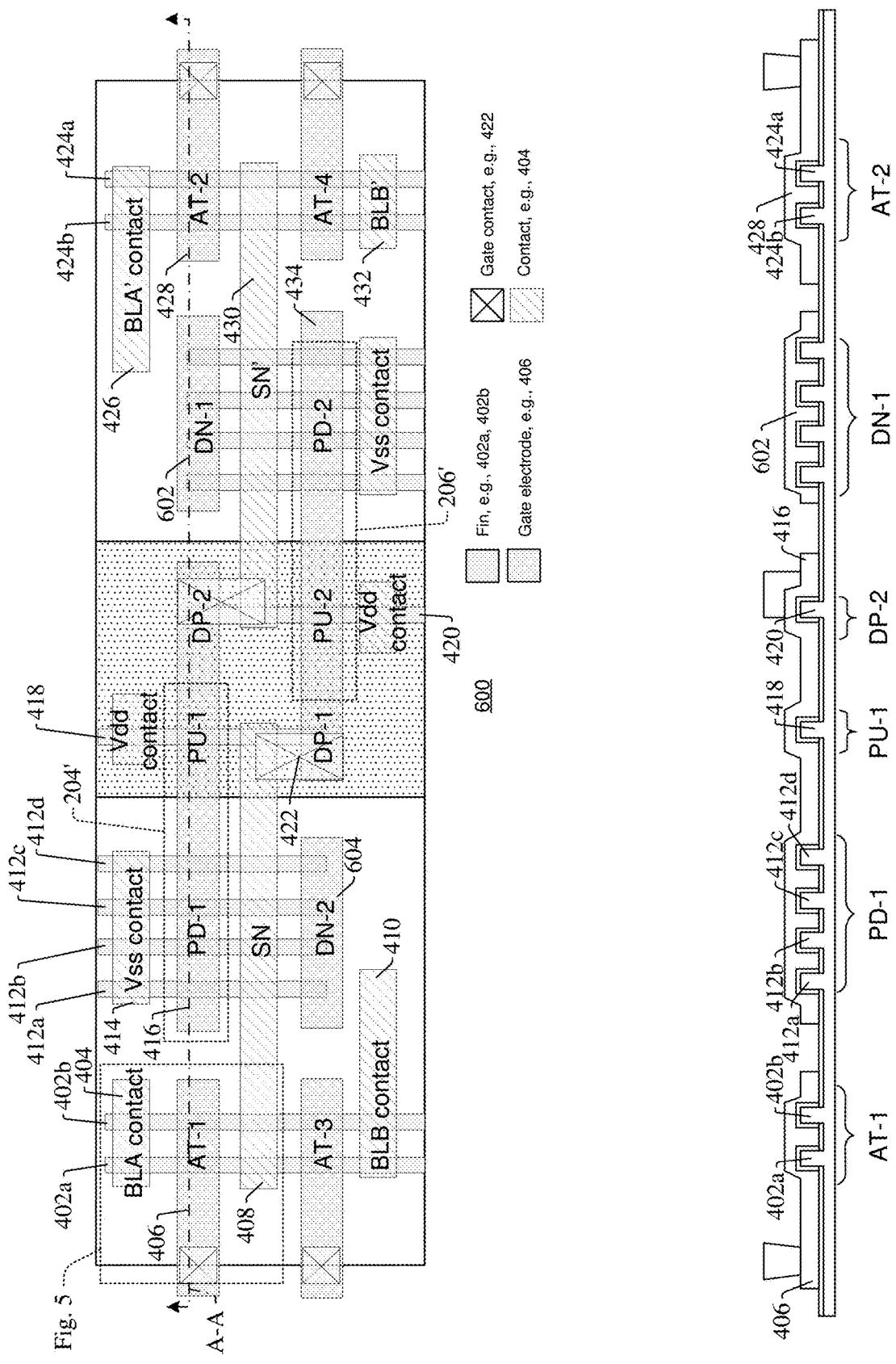
Figure 6C:
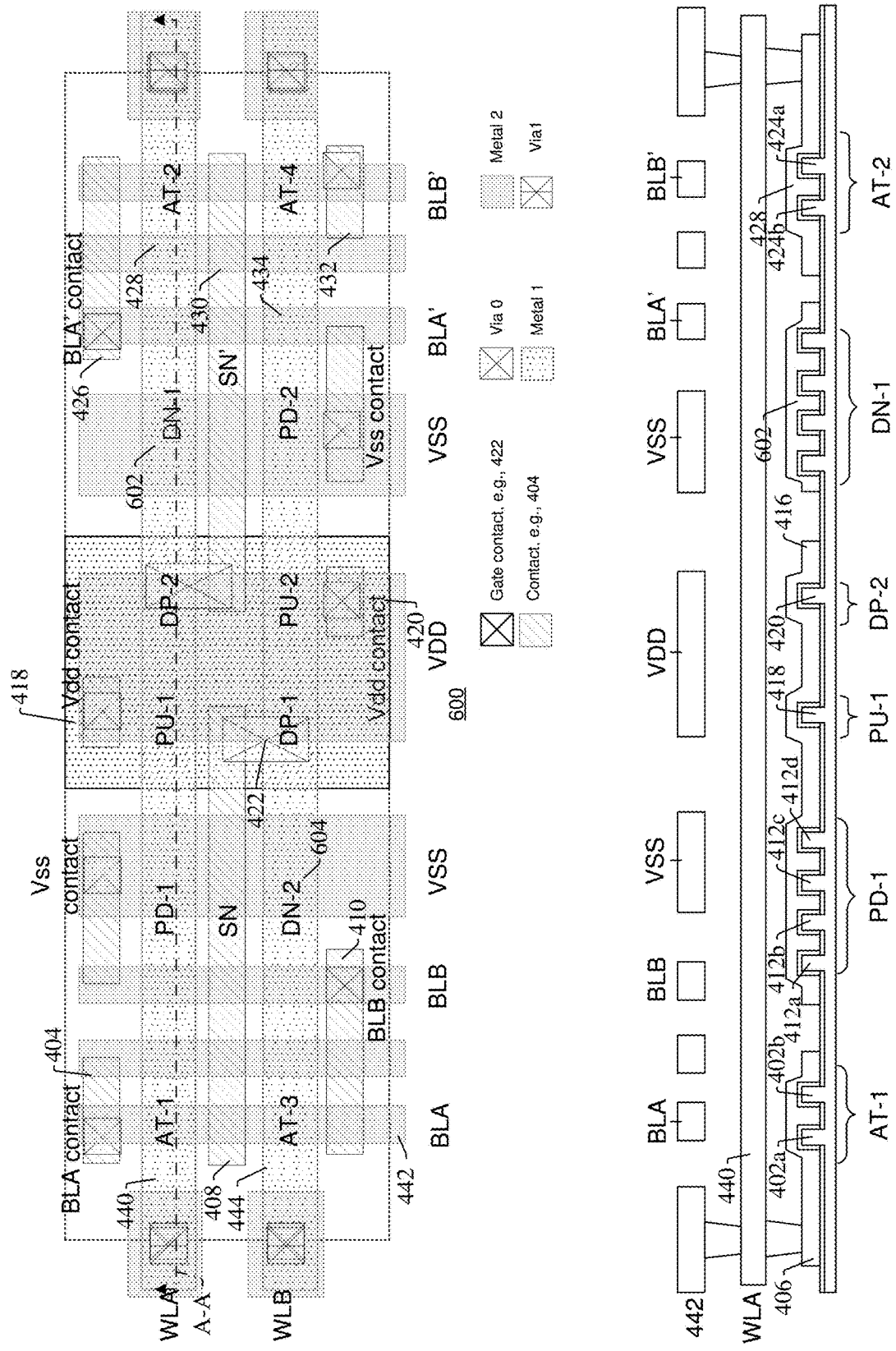

FIGS. 6A-6D show another embodiment of a SRAM DP cell 600 in accordance with some embodiments. Compared to the embodiment of FIG. 4A, the SRAM DP cell 600 of FIGS. 6A-6D is different in that the n-type dummy transistors (DN-1, DN-2) have gate electrodes (602, 604, respectively) which are floating in FIG. 6A-6D, whereas the gate electrodes of DN-1, DN-2 were coupled to the first and second wordlines WLA, WLB in FIGS. 4A-4D. FIG. 6A shows a schematic view of SRAM DP cell 600, while FIGS. 6B-6D show a layout view of the SRAM DP cell 600. FIG. 6B illustrates lower layers of the layout 600 (e.g., fins, gate electrodes, gate contacts, and contacts), FIG. 6C illustrates upper layers of the layout 600 (e.g., contacts, gate contacts, metal1, metal 2, and via1 layers), and FIG. 6D illustrates the superposition of FIGS. 6B-6C.

In FIG. 6A, fins (e.g., 402a, 402ba) extend over a substrate in a first direction (e.g., y-direction). Gate electrodes (e.g., 406, 416, 602, 428, 434) traverse over the fins in a second direction (e.g., x-direction, which is perpendicular to the first direction), and can be made of doped polysilicon or metal for example. The gate electrodes overlie at least one semiconductor fin to establish each fin field effect transistor (FinFET). Transistors PU-1, PU-2, DP-1, and DP-2 correspond to p-type fins, and have n-type source/drain regions on opposite sides of their gates electrodes; while transistors AT-1, PD-1, DN-1, AT-2, AT-3, DN-2, PD-2, and AT-4 correspond to n-type fins and have p-type source/drain regions on opposite sides of their gates. The source/drain regions can be doped regions of the fin in some embodiments, but are often epitaxially grown source/drain regions that exhibit a diamond-shaped cross-sectional profile.

BLA is coupled to fins 402a, 402b, which act as a drain region of transistor AT-1, through contact 404. Fins 402a, 402b of transistor AT-1 extend under gate electrode 406 of AT-1. Source region of AT-1 is coupled to first data storage node SN contact 408 and is coupled to source region of transistor AT-3 though fins 402a, 402b. BLB is coupled to drain region of transistor AT-3 through contact 410. First data storage node SN contact 408 is coupled to fins 412a-412d at drain of transistor PD-1 and at source of transistor DN-2. Source of transistor PD-1 is coupled to Vss through contact 414, while drain of transistor DN-2 is floating. Gate electrode 416 also extends over fin 418 and fin 420 to establish transistors PU-1 and DP-2. Source of transistor PU-1 is coupled to VDD, while drain of PU-1 is coupled to first data storage node SN and butted contact 422. On the other side of the layout 400, BLA' is coupled to fins 424a, 424b, which act as a drain region of transistor AT-2, through contact 426. Fins 424a, 424b of transistor AT-2 extend under gate 428 of AT-2. Source region of AT-2 is coupled to second data storage node SN' contact 430 and is coupled to source region of transistor AT-4 though fins 424a, 424b. BLB' is coupled to drain region of transistor AT-4 through contact 432. Second data storage node SN' contact 430 is coupled to drain of transistor PD-2 and source of transistor DN-1. Source of transistor PD-2 is coupled to Vss, while drain of transistor DN-1 is floating. Gate electrode 434 of PD-2 also extends over fins 420, 418 to establish transistors PU-2, DP-1, respectively. Source of transistor PU-2 is coupled to VDD, while drain of PU-2 is coupled to source of DP-2.

FIGS. 6C-6D illustrates how metal 1, metal 2, and via 1 layers can be stacked over the layout illustrated in FIG. 6B to electrically couple the transistors of SRAM cell layout 600. Metal 1 lines 440, 444 which correspond to a first wordline (WLA) and a second wordline (WLB), respectively, extend over the SRAM cell layout in the second direction. The metal 1 lines 440, 444 are stacked over the gate electrodes. Metal 2 lines 442, which correspond to bitlines (BLA, BLB, BLA', and BLB') and power lines (VSS, VDD) and arranged over the metal 1 lines and extend in the first direction. Gate contacts extend downwardly from the metal 1 lines and/or metal 2 lines to make electrical connection with the gate electrodes. Via1's extend downwardly from the metal 2 lines to make electrical connection with the metal 1 lines.

FIGS. 7A-7D show another embodiment of a SRAM DP cell layout 700 in accordance with some embodiments. Compared to the layout of FIG. 6A-6D, the layout 700 of FIGS. 7A-7D is different in that the n-type dummy transistors (DN-1, DN2) have gate electrodes (602, 604, respectively) which are tied to VSS (ground) in FIG. 7A-7D. For example, in FIGS. 7B-7D, contacts 702, 704, respectively, coupled gate electrodes 602, 604, respectively to VSS. In contrast, in FIG. 4A the gate electrodes of DN-1, DN-2 were coupled to the first and second wordlines WLA, WLB; and in FIG. 6A the gate electrodes of DN-1, DN-2 were left floating. Coupling the gate electrodes of DN-1, DN-2 to ground ensures these transistors are "off", thereby helping to prevent inadvertent leakage.

Figure 7A:
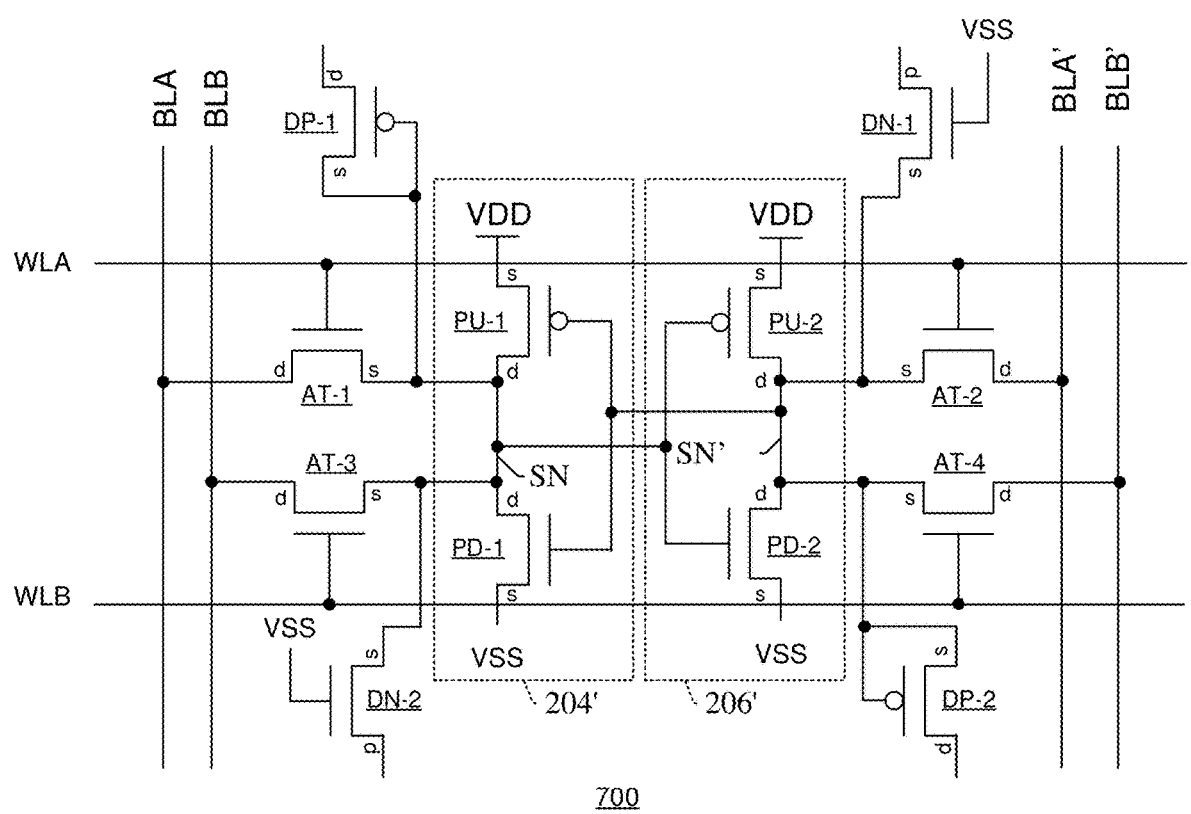
FIGS. 7A-7D illustrate some embodiments of a layout view of an SRAM cell in accordance with some examples of FIG. 3.
Figure 7B:
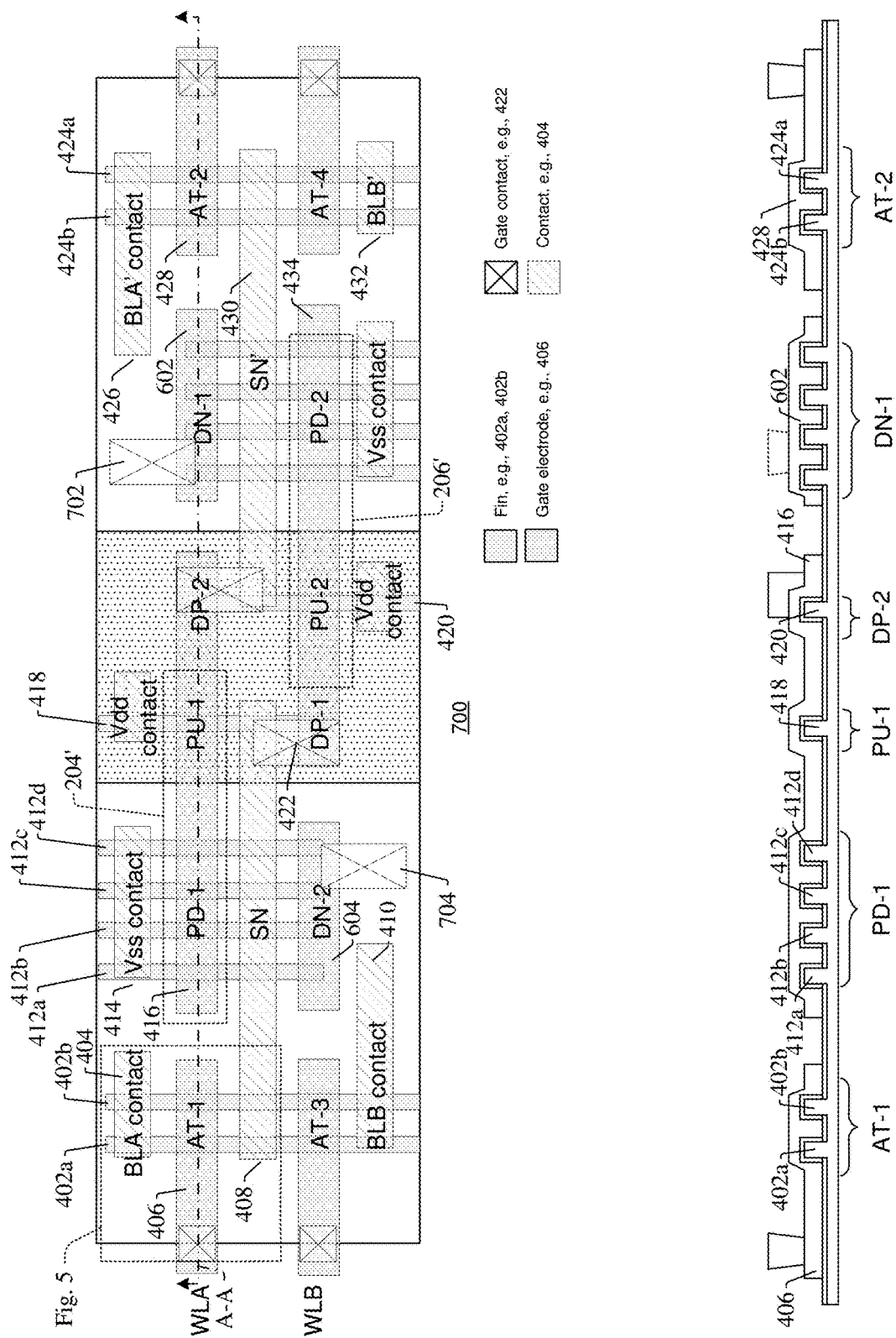

In FIG. 7B, fins (e.g., 402a, 402b) extend over a substrate in a first direction (e.g., y-direction). Gate electrodes (e.g., 406) traverse over the fins in a second direction (e.g., x-direction, which is perpendicular to the first direction), and can be made of doped polysilicon or metal for example. The gate electrodes overlie at least one semiconductor fin to establish each fin field effect transistor (FinFET). Transistors PU-1, PU-2, DP-1, and DP-2 correspond to p-type fins, and have n-type source/drain regions on opposite sides of their gates electrodes; while transistors AT-1, PD-1, DN-1, AT-2, AT-3, DN-2, PD-2, and AT-4 correspond to n-type fins and have p-type source/drain regions on opposite sides of their gates. The source/drain regions can be doped regions of the fin in some embodiments, but are often epitaxially grown source/drain regions that exhibit a diamond-shaped cross-sectional profile.

BLA is coupled to fins 402a, 402b, which act as a drain region of transistor AT-1, through contact 404. Fins 402a, 402b of transistor AT-1 extend under gate electrode 406 of AT-1. Source region of AT-1 is coupled to first data storage node SN contact 408 and is coupled to source region of transistor AT-3 though fins 402a, 402b. BLB is coupled to drain region of transistor AT-3 through contact 410. First data storage node SN contact 408 is coupled to fins 412a-412d at drain of transistor PD-1 and at source of transistor DN-2. Source of transistor PD-1 is coupled to Vss through contact 414, while drain of transistor DN-2 floating. Gate electrode 416 also extends over fin 418 and fin 420 to establish transistors PU-1 and DP-2. Source of transistor PU-1 is coupled to VDD, while drain of PU-1 is coupled to first data storage node SN and butted contact 422. On the other side of the layout 400, BLA' is coupled to fins 424a, 424b, which act as a drain region of transistor AT-2, through contact 426. Fins 424a, 424b of transistor AT-2 extend under gate 428 of AT-2. Source region of AT-2 is coupled to second data storage node SN' contact 430 and is coupled to source region of transistor AT-4 though fins 424a, 424b. BLB' is coupled to drain region of transistor AT-4 through contact 432. Second data storage node SN' contact 430 is coupled to drain of transistor PD-2 and source of transistor DN-1. Source of transistor PD-2 is coupled to Vss, while drain of transistor DN-1 is floating. Gate electrode 434 of PD-2 also extends over fins 420, 418 to establish transistors PU-2, DP-1, respectively. Source of transistor PU-2 is coupled to VDD, while drain of PU-2 is coupled to source of DP-2.

Figure 7C:
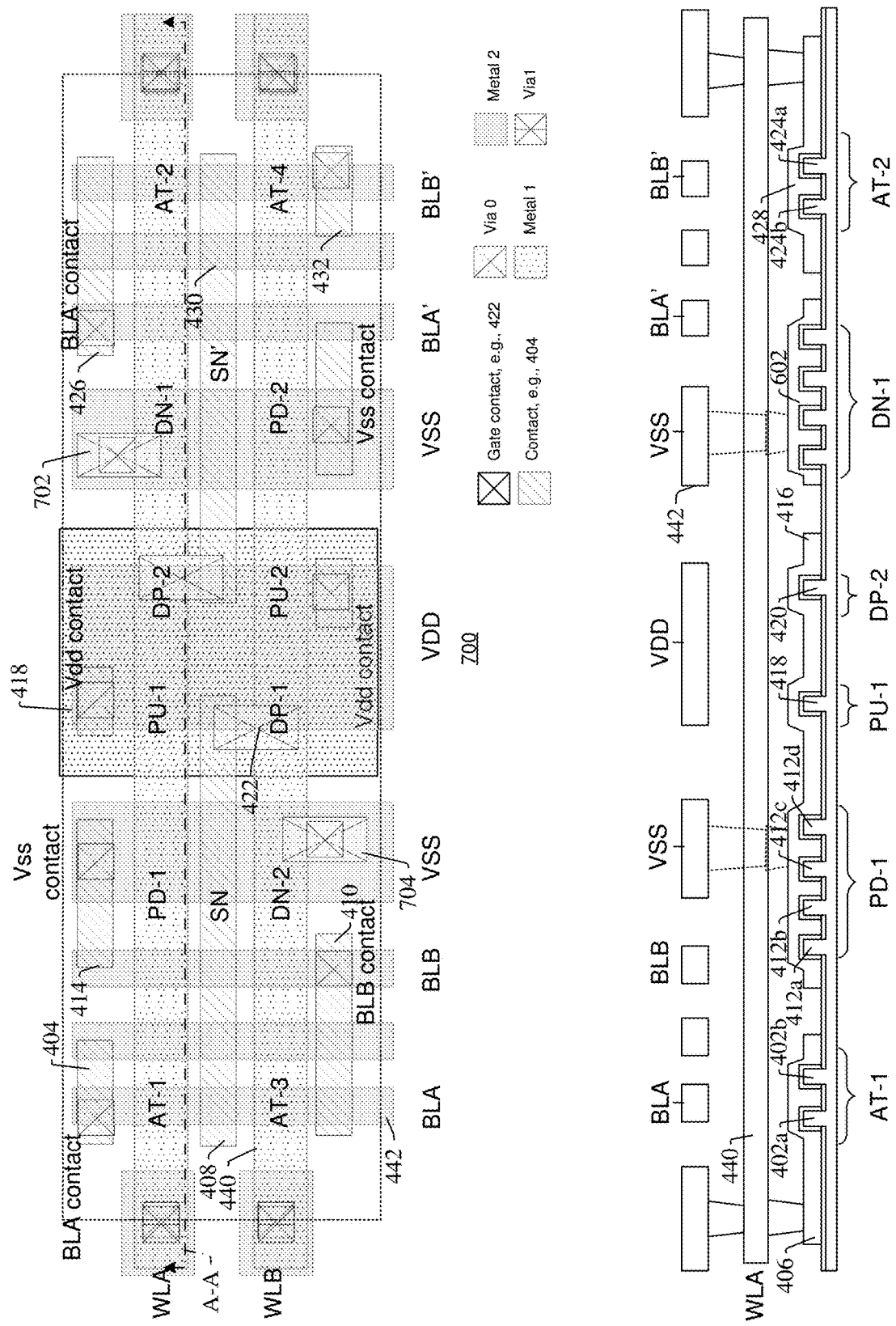
Figure 7D:
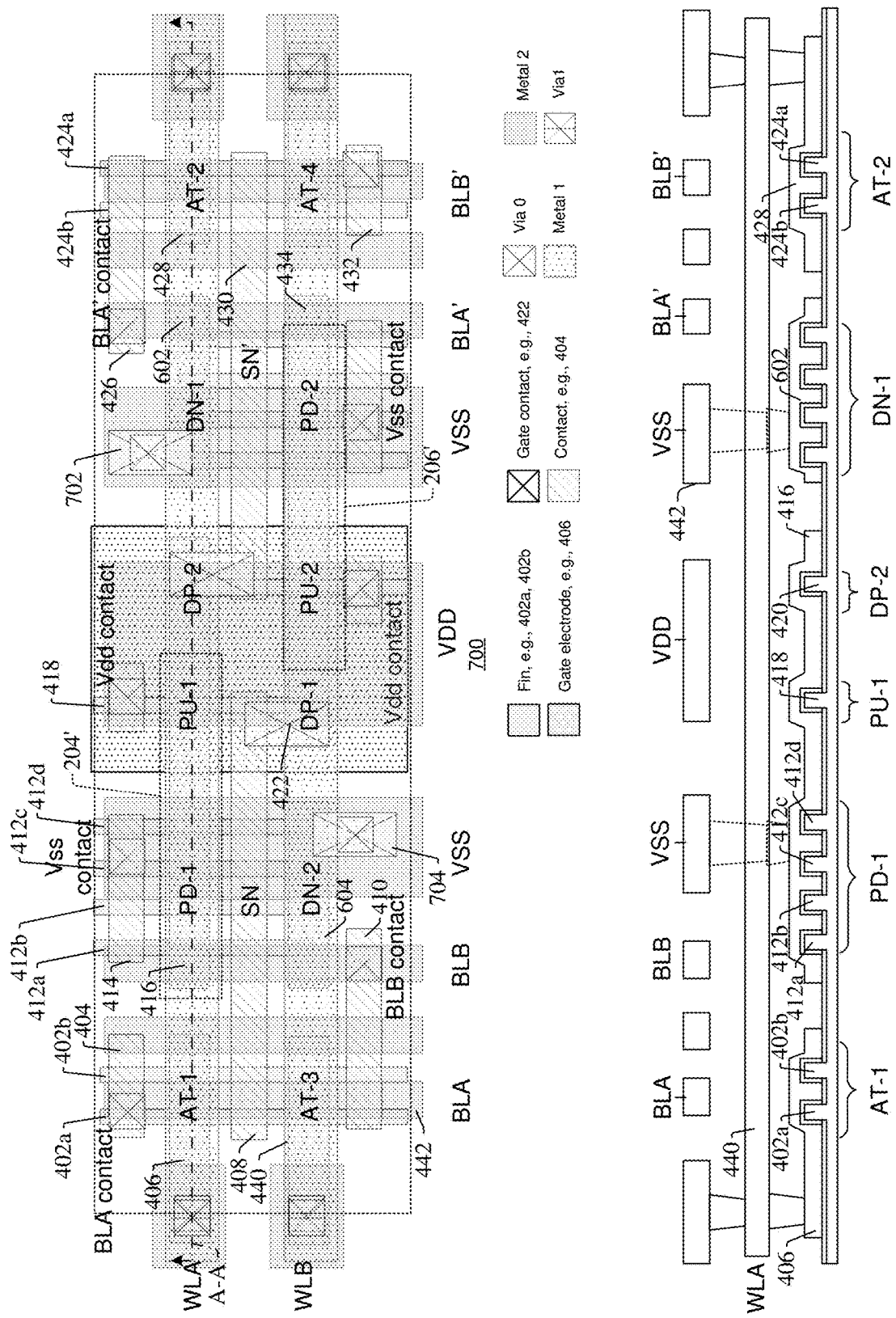

FIGS. 7C-7D illustrates how metal 1, metal 2, and via 1 layers can be stacked over the layout illustrated in FIG. 7B to electrically couple the transistors of SRAM cell layout 700. Metal 1 lines 440, which correspond to a first wordline (WLA) and a second wordline (WLB) extend over the SRAM cell layout in the second direction. The metal 1 lines are stacked over the gate electrodes. Metal 2 lines 442, which correspond to bitlines (BLA, BLB, BLA', and BLB') and power lines (VSS, VDD) and arranged over the metal 1 lines and extend in the first direction. Gate contacts extend downwardly from the metal 1 lines and/or metal 2 lines to make electrical connection with the gate electrodes. Via1's extend downwardly from the metal 2 lines to make electrical connection with the metal 1 lines.

Figure 8A:
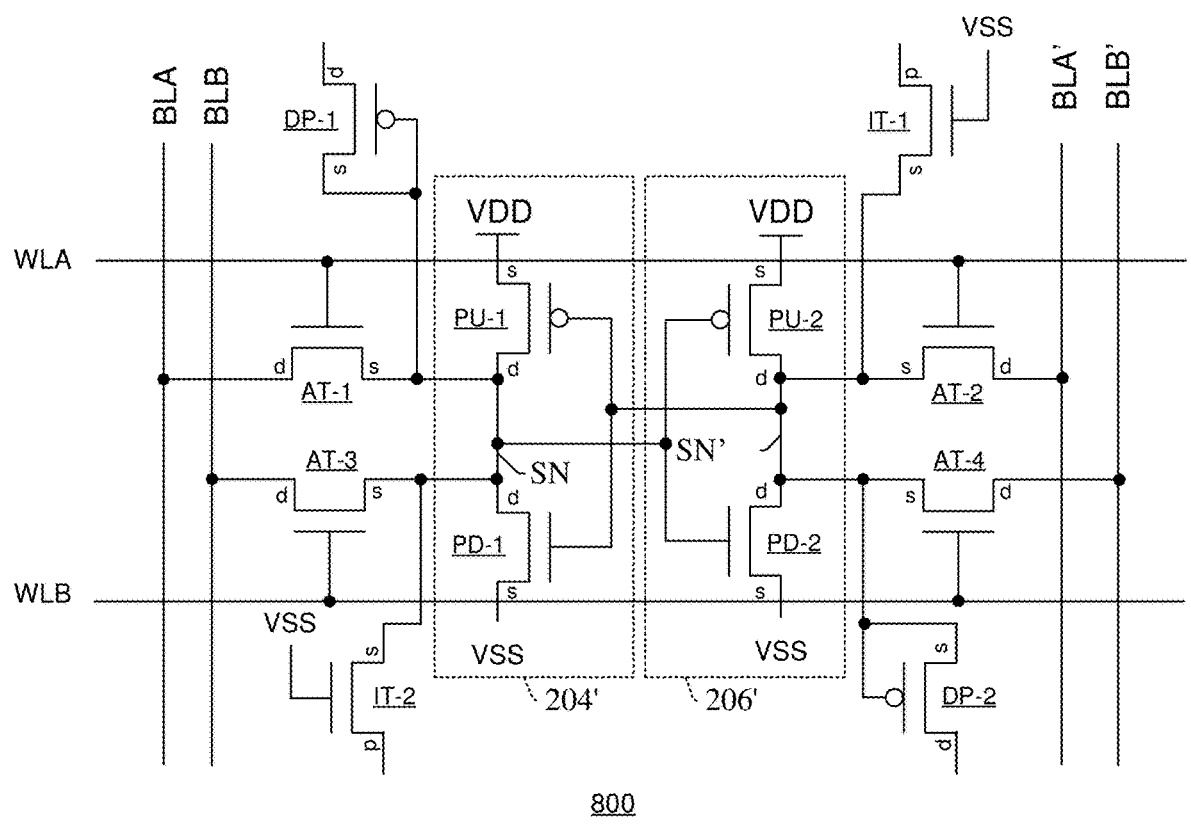
FIGS. 8A-8D illustrate some alternative embodiments of layout view of an SRAM cell consistent with some examples of FIG. 3.
Figure 8B:
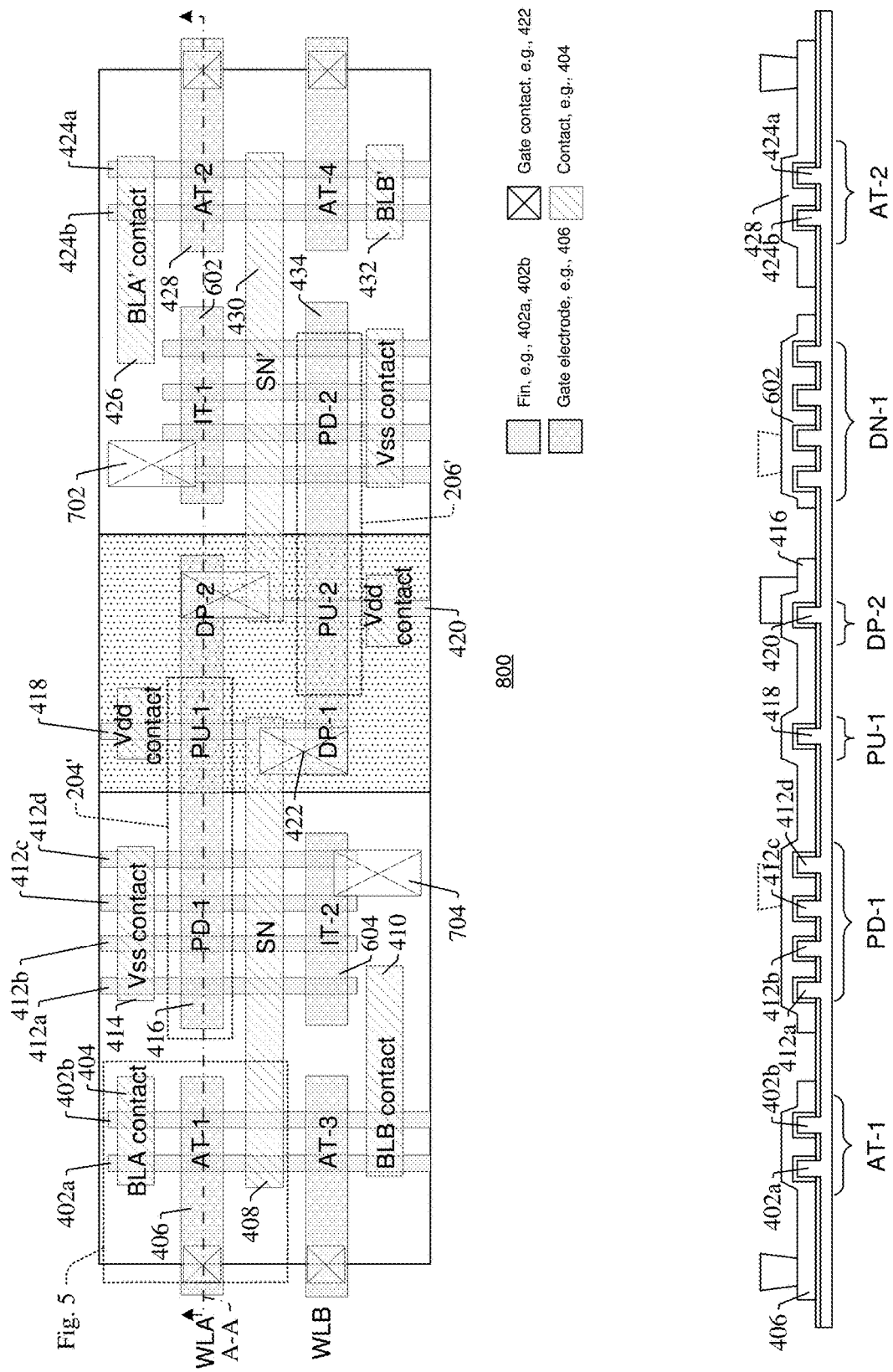
Figure 8C:
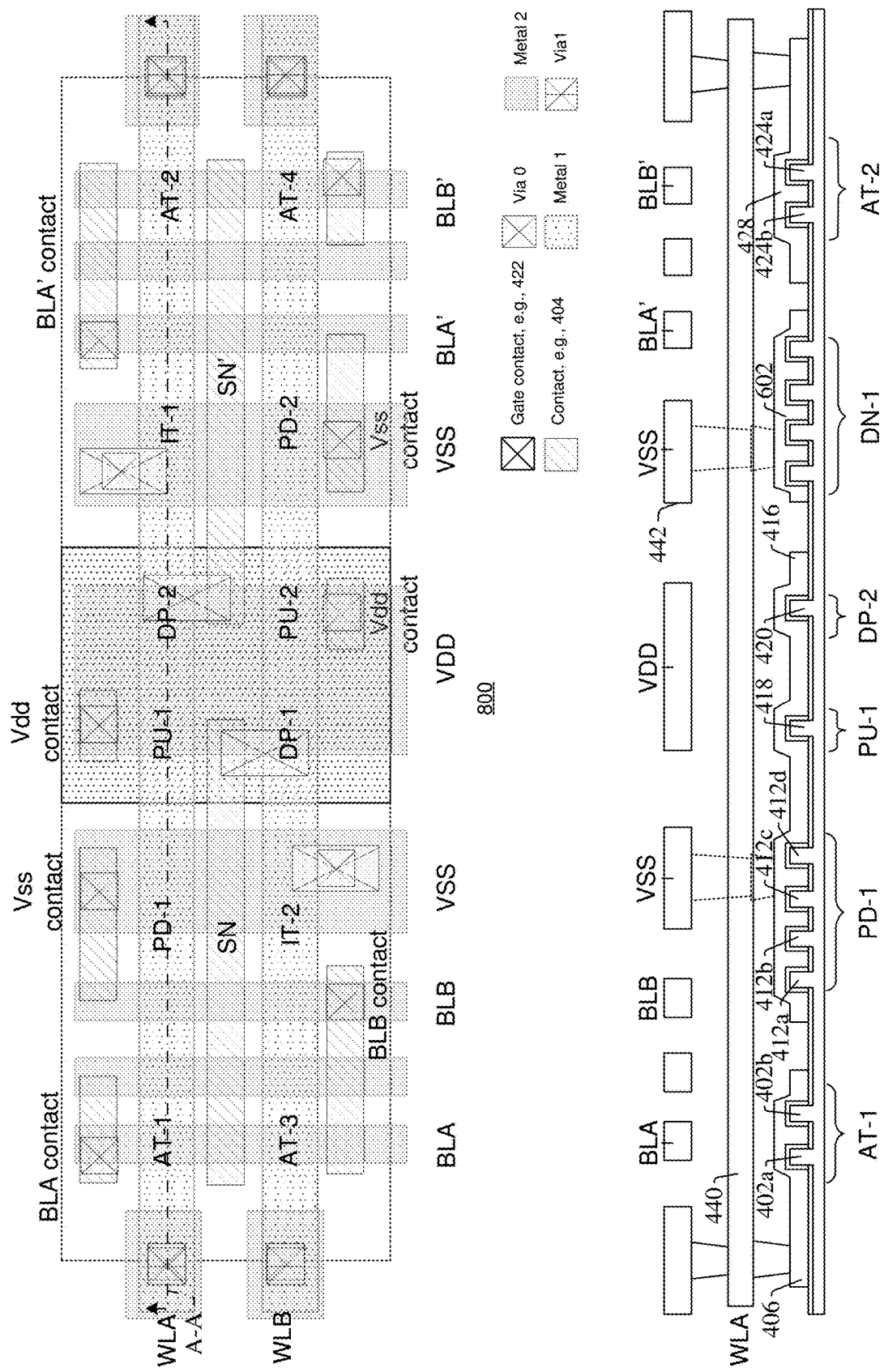
Figure 8D:
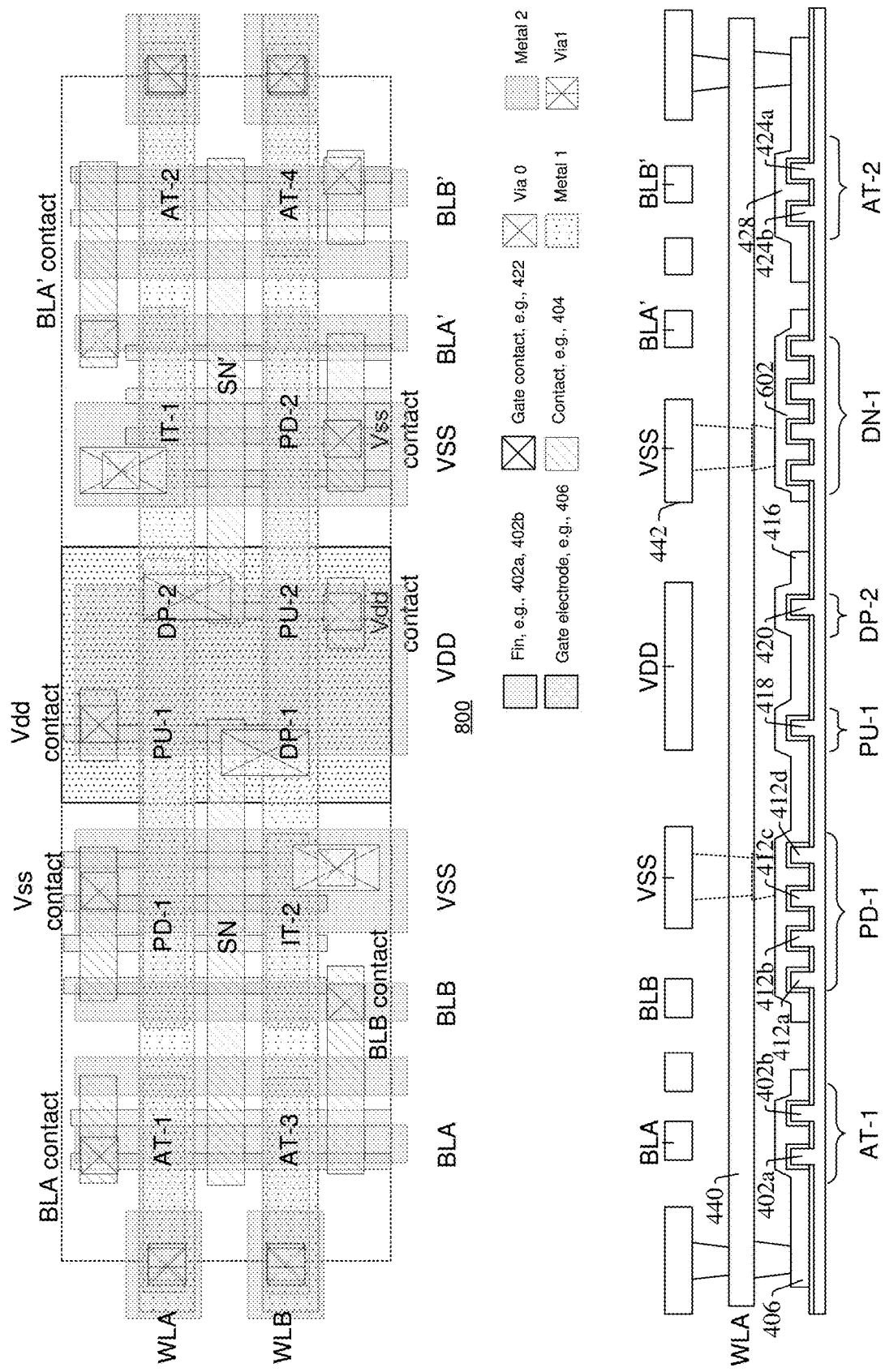

FIGS. 8A-8D show another embodiment of a SRAM DP cell layout 800 in accordance with some embodiments. Compared to the layout of FIGS. 7B-7D, the layout 800 of FIGS. 8B-8D is different in that FIGS. 8B-8D include isolation transistors IT-1, IT-2 in place of the dummy transistors DN-1, DN-2 of FIGS. 7B-7D. The isolation transistors IT-1, IT-2 have fins that extend outwardly beyond both sides of their respective gate electrodes (602, 604, respectively), whereas the dummy transistors DN-1, DN-2 of FIGS. 7B-7D terminated under their gate electrodes without extending outwardly beyond both sides of their respective gate electrodes. The isolation transistors IT-1, IT-2 have gate electrodes that are tied to VSS to ensure these transistors are "off", thereby helping to prevent inadvertent leakage.

In FIG. 8B, fins (e.g., 402a, 402ba) extend over a substrate in a first direction (e.g., y-direction). Gate electrodes (e.g., 406) traverse over the fins in a second direction (e.g., x-direction, which is perpendicular to the first direction), and can be made of doped polysilicon or metal for example. The gate electrodes overlie at least one semiconductor fin to establish each fin field effect transistor (FinFET). Transistors PU-1, PU-2, DP-1, and DP-2 correspond to p-type fins, and have n-type source/drain regions on opposite sides of their gates electrodes; while transistors AT-1, PD-1, IT-1, AT-2, AT-3, IT-2, PD-2, and AT-4 correspond to n-type fins and have p-type source/drain regions on opposite sides of their gates. The source/drain regions can be doped regions of the fin in some embodiments, but are often epitaxially grown source/drain regions that exhibit a diamond-shaped cross-sectional profile.

BLA is coupled to fins 402a, 402b, which act as a drain region of transistor AT-1, through contact 404. Fins 402a, 402b of transistor AT-1 extend under gate electrode 406 of AT-1. Source region of AT-1 is coupled to first data storage node SN contact 408 and is coupled to source region of transistor AT-3 though fins 402a, 402b. BLB is coupled to drain region of transistor AT-3 through contact 410. First data storage node SN contact 408 is coupled to fins 412a-412d at drain of transistor PD-1 and at source of transistor IT-2. Source of transistor PD-1 is coupled to Vss through contact 414, while drain of transistor IT-2 is floating. Gate electrode 416 also extends over fin 418 and fin 420 to establish transistors PU-1 and DP-2. Source of transistor PU-1 is coupled to VDD, while drain of PU-1 is coupled to first data storage node SN and butted contact 422. On the other side of the layout 400, BLA' is coupled to fins 424a, 424b, which act as a drain region of transistor AT-2, through contact 426. Fins 424a, 424b of transistor AT-2 extend under gate 428 of AT-2. Source region of AT-2 is coupled to second data storage node SN' contact 430 and is coupled to source region of transistor AT-4 though fins 424a, 424b. BLB' is coupled to drain region of transistor AT-4 through contact 432. Second data storage node SN' contact 430 is coupled to drain of transistor PD-2 and source of transistor IT-1. Source of transistor PD-2 is coupled to Vss, while drain of transistor IT-1 is floating. Gate electrode 434 of PD-2 also extends over fins 420, 418 to establish transistors PU-2, DP-1, respectively. Source of transistor PU-2 is coupled to VDD, while drain of PU-2 is coupled to source of DP-2.

FIGS. 7C-7D illustrate how metal 1, metal 2, and via 1 layers can be stacked over the layout illustrated in FIG. 7B to electrically couple the transistors of SRAM cell layout 700. Metal 1 lines 440, which correspond to a first wordline (WLA) and a second wordline (WLB) extend over the SRAM cell layout in the second direction. The metal 1 lines are stacked over the gate electrodes. Metal 2 lines 442, which correspond to bitlines (BLA, BLB, BLA', and BLB') and power lines (VSS, VDD) and arranged over the metal 1 lines and extend in the first direction. Gate contacts extend downwardly from the metal 1 lines and/or metal 2 lines to make electrical connection with the gate electrodes. Via1's extend downwardly from the metal 2 lines to make electrical connection with the metal 1 lines.

Although the present disclosure has been illustrated and described above in the context of DP SRAM devices, will be appreciated the disclosure is also applicable to other types of SRAM memory devices, such as single-port SRAM devices or SRAM devices with more than two ports. Further, whereas SRAM devices store data in cross-coupled inverters, some embodiments of the present disclosure can also be applied to other types of memory where data is stored in other types of data storage elements, such as magneto-resistive memory elements (e.g., in MRAM devices), capacitive memory elements (e.g., in DRAM devices), phase change memory elements (in PCRAM devices), ferroelectric memory elements (e.g., in FeRAM devices), and variable resistive memory elements (e.g., in RRAM devices), among others. Further, although some aspects of the present disclosure have been illustrated with respect to FinFET devices, the present disclosure is also applicant to planar field effect transistor devices, such as metal oxide semiconductor field effect transistors (MOSFETs), for example.

In addition, although the present disclosure has been illustrated and described above in the context of SRAM cells which are each made up of eight transistors—so called "8T" SRAM cells—the present disclosure is also applicable to single-port SRAM cells consisting of six transistors—so called "6T" SRAM cells. Typical 6T SRAM cells include two cross-coupled inverters, such as inverters 204, 206 in FIG. 2, and also include only two access transistors rather than the four access transistors illustrated in FIG. 2. One of these two access transistors, which can be analogous to AT-1 208 in FIG. 2, has a first source/drain coupled to a storage node (SN), a second source/drain coupled to a BL, and a gate coupled to a wordline; while the other these two access transistors, which can be analogous to AT-2 210 in FIG. 2, has a first source/drain coupled to a complementary storage node (SN'), a second source/drain coupled to a complementary BL', and a gate coupled to the wordline. The 6T and 8T SRAM cells can all use the same metal routing scheme to simplify SRAM periphery design and power mesh design. For example, in some embodiments, the 6T and 8T SRAM cells have wordlines routed in metal 1 lines (see e.g., WLA, WLB in FIG. 4C), and can have bitlines, complementary bitlines, VSS and VDD lines routed in metal 2 lines (see e.g., BLA, BLB, VSS, VDD in FIG. 4C). The 6T and 8T SRAM cells can have cell height in the y-direction, and in some embodiments this height can be two times the gate electrode pitch. For example, FIG. 4D illustrates SRAM cell having a cell height of h in the y-direction (where h is measured between uppermost and lowermost edges of the SRAM cell), and a gate electrode pitch of p (wherein the gate electrode pitch is measured between centerlines of neighboring gate electrodes), wherein the cell height, h, can equal twice the gate pitch, p (e.g., h=2p).

Thus, some embodiments of the present disclosure relate to a static random access memory (SRAM) device including a plurality of SRAM cells. An SRAM cell includes first and second inverters which are cross-coupled to one another to establish first and second data storage nodes, which are complementary. A first access transistor includes a first source/drain region coupled to the first data storage node, a first drain/source region coupled to a first bitline, and a first gate region coupled to a wordline. A second access transistor includes a second source/drain region coupled to the second complementary data storage node, a second drain/source region coupled to a second bitline, and a second gate region coupled to the wordline. A first dummy transistor has a first dummy source/drain region coupled to the first source/drain region of the first access transistor. A second dummy transistor has a second dummy source/drain region coupled to the second source/drain region of the second access transistor.

In other embodiments, a memory device includes a first inverter and a second inverter which are cross-coupled to establish a data storage element. The memory device includes a plurality of semiconductor fins extending in parallel with one another in a first direction over a semiconductor substrate. A first fin of the plurality of semiconductor fins corresponds to a first pull-up transistor of the first inverter, and a second fin of the plurality of semiconductor fins corresponds to a first pull-down transistor of the first inverter. A first gate electrode extends in a second direction, which is perpendicular to the first direction, to straddle the first fin at a channel region of the first pull-up transistor. The first gate electrode continues linearly in the second direction to straddle the second fin at a channel region of the first pull-down transistor. A second gate electrode extends in parallel with the first gate electrode in the second direction but is spaced apart from the first gate electrode in the first direction to establish a first dummy transistor structure for the first fin. Extension of the first fin in the first direction terminates so an end face of the first fin resides under the second gate electrode and within outer sidewalls of the second gate electrode.

In still other embodiments, the present disclosure relates to a memory device including a plurality of memory cells. A memory cell includes a data storage element which has first and second complementary data storage nodes. A first access transistor has a gate coupled to a first wordline, a first source/drain region coupled to the first data storage node, and a first drain/source region coupled to a first bitline. A second access transistor has a gate coupled to a second wordline, a second source/drain region coupled to the second data storage node, and a second drain/source region coupled to a second bitline. A first dummy transistor has a gate and a first dummy source/drain region that are coupled to the first data storage node. A second dummy transistor has a second dummy source/drain region coupled to the second data storage node. The second dummy transistor has a gate that is floating, coupled to VSS, or coupled to the second wordline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a first silicon fin extending in a first direction over the semiconductor substrate as viewed from above, the first silicon fin having a first fin end;
a second silicon fin over the semiconductor substrate and extending in parallel with the first silicon fin as viewed from above, the second silicon fin having a second fin end;
a first dummy gate electrode extending in a second direction that is perpendicular to the first direction as viewed from above, the first dummy gate electrode extending over the first fin end of the first silicon fin as viewed in cross-section, wherein the first dummy gate electrode is made of a conductive material comprising doped polysilicon or metal and is floating;

a second dummy gate electrode extending in the second direction and in parallel with the first dummy gate electrode as viewed from above, the second dummy gate electrode extending over the second fin end of the second silicon fin, wherein the second dummy gate electrode is made of the conductive material and is floating;

a first gate electrode extending over the first silicon fin and extending in parallel with the first dummy gate electrode and the second dummy gate electrode as viewed from above, the first gate electrode arranged between the first dummy gate electrode and the second dummy gate electrode as viewed from above and being made of the conductive material; and a second gate electrode extending over the second silicon fin and extending in parallel with the first dummy gate electrode and the second dummy gate electrode as viewed from above, the second gate electrode arranged between the first gate electrode and the second dummy gate electrode as viewed from above and being made of the conductive material.

2. The semiconductor device of claim 1, wherein the first silicon fin has a first fin length between the first fin end and a third fin end, and the second silicon fin has a second fin length between the second fin end and a fourth fin end, and the first fin length is equal to the second fin length.

3. The semiconductor device of claim 1, further comprising:
a gate dielectric extending along an upper surface of the first silicon fin to separate a lower surface of the first dummy gate electrode from the upper surface of the first silicon fin.

4. The semiconductor device of claim 3, further comprising first and second sidewall spacers on opposite sides of the first dummy gate electrode, wherein the first sidewall spacer has a first height and the second sidewall spacer has a second height that is less than the first height.

5. The semiconductor device of claim 1, further comprising:
an epitaxial source/drain region disposed in the first silicon fin.

6. The semiconductor device of claim 5, further comprising:
a source/drain contact disposed over and in contact with the epitaxial source/drain region, wherein an upper surface of the source/drain contact is substantially planar with an upper surface of the first dummy gate electrode.

7. The semiconductor device of claim 1, wherein the first dummy gate electrode has a lower surface at a first height over an upper surface of the semiconductor substrate, and the first gate electrode has a lower surface at a second height over an upper surface of the semiconductor substrate, the second height being greater than the first height.

8. A semiconductor device, comprising:
a semiconductor substrate;
a plurality of fins made of monocrystalline silicon extending in a first direction as viewed from above, each fin extending between a first fin end and a second fin end;
a first dummy gate electrode extending in a second direction that is perpendicular to the first direction as viewed from above, the first dummy gate electrode extending over a first fin end of the plurality of fins and the first dummy gate electrode having a lower surface at a first height over an upper surface of the semiconductor substrate as viewed in cross-section, wherein the first dummy gate electrode is made of a conductive material comprising doped polysilicon or metal;

a second dummy gate electrode extending in the second direction and in parallel with the first dummy gate electrode as viewed from above, the second dummy gate electrode extending over a second fin end of the plurality of fins as viewed in cross-section and being made of the conductive material; and a first gate electrode extending over the plurality of fins and extending in parallel with the first dummy gate electrode and the second dummy gate electrode as viewed from above, the first gate electrode arranged between the first dummy gate electrode and the second dummy gate electrode and having a lower surface at a second height over an upper surface of the semiconductor substrate, the second height being greater than the first height and the first gate electrode being made of the conductive material.

9. The semiconductor device of claim 8, wherein the second dummy gate electrode is floating.

10. The semiconductor device of claim 8, further comprising:
a second gate electrode extending over the plurality of fins and extending in parallel with the first dummy gate electrode and the second dummy gate electrode, the second gate electrode arranged between the first gate electrode and the second dummy gate electrode.

11. The semiconductor device of claim 8, further comprising:
an epitaxial source/drain region disposed in the first fin end; and
a first rectangular contact arranged between the between first gate electrode and the first dummy gate electrode, the first rectangular contact landing on the epitaxial source/drain region.

12. A memory device including a plurality of memory cells on a semiconductor substrate, a memory cell comprising:
a data storage element which has first and second data storage nodes, the first and second data storage nodes being complementary;
a first access transistor having a gate coupled to a first wordline, a first source/drain region disposed in a first fin of semiconductor material extending up from the semiconductor substrate, the first access transistor coupled to the first data storage node, and a first drain/source region coupled to a first bitline;
a second access transistor having a gate coupled to a second wordline, a second source/drain region disposed in a second fin of semiconductor material extending up from the semiconductor substrate, the second access transistor coupled to the second data storage node, and a second drain/source region coupled to a second bitline; and
a first dummy transistor having a gate and a first dummy source/drain region that are coupled to the first data storage node or the second data storage node, the gate of the first dummy transistor covering a first end of the first fin or a second end of the second fin and being floating.

13. The memory device of claim 12, wherein the data storage element comprises:
a first inverter; and
a second inverter cross-coupled with the first inverter to establish the first and second data storage nodes.

14. The memory device of claim 13, wherein the first inverter includes a first pull-down transistor and a first pull-up transistor, and wherein the first pull-down transistor and the first dummy transistor are disposed in one or more fins which extend vertically upwards from the semiconductor substrate and which are co-linear with one another.

15. The memory device of claim 13, wherein the first inverter includes a first pull-down transistor and a first pull-up transistor, and wherein the first pull-down transistor and the first dummy transistor are disposed in one or more fins which extend upwards from the semiconductor substrate.

16. The memory device of claim 15, wherein the one or more fins are co-linear with one another.

17. The memory device of claim 12, wherein the first dummy transistor is p-type.

18. The memory device of claim 12, wherein the first dummy transistor is n-type.

19. The memory device of claim 13, further comprising:
  a third access transistor having a gate coupled to the second wordline, a third source/drain region coupled to the first data storage node, and a third drain/source region coupled to a third bitline; and
  a fourth access transistor having a gate coupled to the second wordline, a fourth source/drain region coupled to the second data storage node, and a fourth drain/source region coupled to a fourth bitline, the fourth bitline being complementary to the third bitline.

20. The memory device of claim 12, wherein the first wordline and the second wordline are metal 1 lines.

\* \* \* \* \*